US011313886B2

(12) United States Patent
Hatani et al.

(10) Patent No.: US 11,313,886 B2
(45) Date of Patent: Apr. 26, 2022

(54) VOLTAGE DETECTION CIRCUIT MEASUREMENT APPARATUS FOR USE IN ASSEMBLED BATTERY SYSTEM

(71) Applicants: PANASONIC SEMICONDUCTOR SOLUTIONS CO., LTD., Kyoto (JP); NUVOTON TECHNOLOGY SINGAPORE PTE. LTD., Singapore (SG)

(72) Inventors: Naohisa Hatani, Kyoto (JP); Yosuke Goto, Osaka (JP); Fumihito Inukai, Kyoto (JP); Gorou Mori, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 128 days.

(21) Appl. No.: 16/642,845

(22) PCT Filed: Aug. 28, 2018

(86) PCT No.: PCT/JP2018/031832
§ 371 (c)(1),
(2) Date: Feb. 27, 2020

(87) PCT Pub. No.: WO2019/044856
PCT Pub. Date: Mar. 7, 2019

(65) Prior Publication Data
US 2020/0408814 A1 Dec. 31, 2020

(30) Foreign Application Priority Data
Aug. 29, 2017 (JP) .............................. JP2017-164273

(51) Int. Cl.
H01M 10/46 (2006.01)
G01R 19/25 (2006.01)
(Continued)

(52) U.S. Cl.
CPC ..... *G01R 19/2503* (2013.01); *G01R 31/3835* (2019.01); *G01R 31/396* (2019.01);
(Continued)

(58) Field of Classification Search
CPC ........ H02J 7/04; H02J 7/00032; H02J 7/0013; G01R 19/2503; G01R 31/3835;
(Continued)

(56) References Cited

U.S. PATENT DOCUMENTS

2004/0160229 A1* 8/2004 Fujita ...................... B60L 50/72
324/607

FOREIGN PATENT DOCUMENTS

JP 2012-079618 A 4/2012
JP 5492044 B2 5/2014

OTHER PUBLICATIONS

Translation of the International Prelimianry Report on Patentability issued iin corresponding International Patent Application No. PCT/JP2018/031832, dated Mar. 3, 2020.
(Continued)

*Primary Examiner* — Edward Tso
(74) *Attorney, Agent, or Firm* — McDermott Will & Emery LLP

(57) ABSTRACT

A voltage detection circuit measures a plurality of cell voltages of an assembled battery configured by connecting a plurality of cells in series. The voltage detection circuit includes a plurality of input terminals connected to respective electrodes of the plurality of cells through a plurality of voltage detection lines; a multiplexer that periodically selects and outputs voltages of a plurality of cells in a group, a plurality of series cells configured as the group; an analog-to-digital (AD) converter that AD-converts an output voltage from the multiplexer and outputs digital data of the output voltage; and a control circuit that controls a timing for (Continued)

the selection by the multiplexer and a timing for the AD conversion. The control circuit switches over a time interval for which the multiplexer selects each of the cells to change a period of the AD conversion.

10 Claims, 35 Drawing Sheets

(51) Int. Cl.
| | |
|---|---|
| *G01R 31/396* | (2019.01) |
| *G01R 31/3835* | (2019.01) |
| *H01M 10/44* | (2006.01) |
| *H01M 10/48* | (2006.01) |
| *H02J 7/04* | (2006.01) |
| *H03M 1/34* | (2006.01) |

(52) U.S. Cl.
CPC ............ *H01M 10/44* (2013.01); *H01M 10/48* (2013.01); *H02J 7/04* (2013.01); *H03M 1/34* (2013.01)

(58) Field of Classification Search
CPC .. G01R 31/396; H01M 10/482; H01M 10/44; H01M 10/48
USPC .................. 320/116, 117, 132, 134, 136, 149
See application file for complete search history.

(56) References Cited

OTHER PUBLICATIONS

International Search Report issued in corresponding International Patent Application No. PCT/JP2018/031832, dated Dec. 4, 2018, with English translation.

* cited by examiner

Fig.3

| CYCLIC PERIOD | FIRST CYCLE | | | | | | | SECOND CYCLE | | | | | | | THIRD CYCLE | | | | | | |
|---|---|---|---|---|---|---|---|---|---|---|---|---|---|---|---|---|---|---|---|---|---|
| SLOT | 1 | 2 | 3 | 4 | 5 | 6 | | 1 | 2 | 3 | 4 | 5 | 6 | | 1 | 2 | 3 | 4 | 5 | 6 | |
| SELECTION TARGET | RESET | CELL 1 | CELL 2 | CELL 3 | CELL 4 | CELL 5 | | RESET | CELL 1 | CELL 2 | CELL 3 | CELL 4 | CELL 5 | | RESET | CELL 1 | CELL 2 | CELL 3 | CELL 4 | CELL 5 | |

Fig.5

| CYCLIC PERIOD | FIRST CYCLE | | | | | | | SECOND CYCLE | | | | | | | THIRD CYCLE | | | | | | |
|---|---|---|---|---|---|---|---|---|---|---|---|---|---|---|---|---|---|---|---|---|---|
| SLOT | 1 | 2 | 3 | 4 | 5 | 6 | 7 | 1 | 2 | 3 | 4 | 5 | 6 | 7 | 1 | 2 | 3 | 4 | 5 | 6 | 7 |
| SELECTION TARGET | - | RESET | CELL 1 | CELL 2 | CELL 3 | CELL 4 | CELL 5 | RESET | CELL 3 | CELL 4 | CELL 5 | RESET | CELL 1 | CELL 2 | RESET | CELL 5 | RESET | CELL 1 | CELL 2 | CELL 3 | CELL 4 |

Fig.9

| CYCLIC PERIOD | FIRST CYCLE | | | | | | | SECOND CYCLE | | | | | | | THIRD CYCLE | | | | | | |
|---|---|---|---|---|---|---|---|---|---|---|---|---|---|---|---|---|---|---|---|---|---|
| SLOT | 1 | 2 | 3 | 4 | 5 | 6 | 7 | 1 | 2 | 3 | 4 | 5 | 6 | 7 | 1 | 2 | 3 | 4 | 5 | 6 | 7 |
| SELECTION TARGET | — | RESET | CELL 1 | CELL 2 | CELL 3 | CELL 4 | CELL 5 | PRECHARGE + RESET | CELL 3 | CELL 4 | CELL 5 | RESET | CELL 1 | CELL 2 | PRECHARGE + RESET | CELL 5 | RESET | CELL 1 | CELL 2 | CELL 3 | CELL 4 |

| SLOT | 1-1 | 1-2 | 1-3 |
|---|---|---|---|
| OPERATION | RESET | PRECHARGE | |
| | | CELL 1 | CELL 2 |

| SLOT | 1-1 | 1-2 | 1-3 | 1-4 | 1-5 |
|---|---|---|---|---|---|
| OPERATION | RESET | PRECHARGE | | | |
| | | CELL 1 | CELL 2 | CELL 3 | CELL 4 |

Fig. 10

| CYCLIC PERIOD | FIRST CYCLE | | | | | | | SECOND CYCLE | | | | | | | THIRD CYCLE | | | | | | |
|---|---|---|---|---|---|---|---|---|---|---|---|---|---|---|---|---|---|---|---|---|---|
| SLOT | 1 | 2 | 3 | 4 | 5 | 6 | 7 | 1 | 2 | 3 | 4 | 5 | 6 | 7 | 1 | 2 | 3 | 4 | 5 | 6 | 7 |
| SELECTION TARGET | – | RESET | CELL 1 | CELL 2 | CELL 3 | CELL 4 | CELL 5 | PRECHARGE + RESET | CELL 3 | CELL 4 | CELL 5 | RESET | CELL 1 | CELL 2 | PRECHARGE + RESET | CELL 5 | RESET | CELL 1 | CELL 2 | CELL 3 | CELL 4 |

PRECHARGE + RESET (second cycle, slot 1):

| SLOT | 1-1 | 1-2 |
|---|---|---|
| OPERATION | RESET | PRECHARGE CELL 2 |

PRECHARGE + RESET (third cycle, slot 1):

| SLOT | 1-1 | 1-2 | 1-3 |
|---|---|---|---|
| OPERATION | RESET | PRECHARGE CELL 2 | PRECHARGE CELL 4 |

Fig.11

| CYCLIC PERIOD | FIRST CYCLE | | | | | | | SECOND CYCLE | | | | | | | THIRD CYCLE | | | | | | |
|---|---|---|---|---|---|---|---|---|---|---|---|---|---|---|---|---|---|---|---|---|---|
| SLOT | 1 | 2 | 3 | 4 | 5 | 6 | 7 | 1 | 2 | 3 | 4 | 5 | 6 | 7 | 1 | 2 | 3 | 4 | 5 | 6 | 7 |
| SELECTION TARGET | – | RESET | CELL 1 | CELL 2 | CELL 3 | CELL 4 | CELL 5 | PRECHARGE + RESET | CELL 3 | CELL 4 | CELL 5 | RESET | CELL 1 | CELL 2 | PRECHARGE + RESET | CELL 5 | RESET | CELL 1 | CELL 2 | CELL 3 | CELL 4 |

| SLOT | 1-1 | 1-2 | 1-3 |
|---|---|---|---|
| OPERATION | RESET | PRECHARGE CELL 1 | CELL 2 |

| SLOT | 1-1 | 1-2 | 1-3 |
|---|---|---|---|
| OPERATION | RESET | PRECHARGE CELL 2 | CELL 4 |

Fig.12

| CYCLIC PERIOD | FIRST CYCLE | | | | | | | SECOND CYCLE | | | | | | | THIRD CYCLE | | | | | | |
|---|---|---|---|---|---|---|---|---|---|---|---|---|---|---|---|---|---|---|---|---|---|
| SLOT | 1 | 2 | 3 | 4 | 5 | 6 | 7 | 1 | 2 | 3 | 4 | 5 | 6 | 7 | 1 | 2 | 3 | 4 | 5 | 6 | 7 |
| SELECTION TARGET | — | PRECHARGE + RESET | CELL 1 | CELL 2 | CELL 3 | CELL 4 | CELL 5 | PRECHARGE + RESET | CELL 3 | CELL 4 | CELL 5 | RESET | CELL 1 | CELL 2 | PRECHARGE + RESET | CELL 5 | RESET | CELL 1 | CELL 2 | CELL 3 | CELL 4 |

| SLOT | 2-1 | 2-2 |
|---|---|---|
| OPERATION | RESET | PRECHARGE CELL 1 |

| SLOT | 1-1 | 1-2 | 1-3 |
|---|---|---|---|
| OPERATION | RESET | PRECHARGE CELL 2 | CELL 3 |

| SLOT | 1-1 | 1-2 | 1-3 | 1-4 |
|---|---|---|---|---|
| OPERATION | RESET | PRECHARGE CELL 2 | CELL 4 | CELL 5 |

Fig.14

| CYCLIC PERIOD | FIRST CYCLE | | | | | | | SECOND CYCLE | | | | | | | THIRD CYCLE | | | | | | |
|---|---|---|---|---|---|---|---|---|---|---|---|---|---|---|---|---|---|---|---|---|---|
| SLOT | 1 | 2 | 3 | 4 | 5 | 6 | | 1 | 2 | 3 | 4 | 5 | 6 | 7 | 1 | 2 | 3 | 4 | 5 | 6 | 7 |
| SELECTION TARGET | RESET | CELL 1 | CELL 2 | CELL 3 | CELL 4 | CELL 5 | | PRECHARGE + RESET | CELL 3 | CELL 4 | CELL 5 | RESET | CELL 1 | CELL 2 | PRECHARGE + RESET | CELL 5 | RESET | CELL 1 | CELL 2 | CELL 3 | CELL 4 |

| SLOT | 1-1 | 1-2 | 1-3 |
|---|---|---|---|
| OPERATION | RESET | PRECHARGE | CELL 1 | CELL 2 |

| SLOT | 1-1 | 1-2 | 1-3 | 1-4 | 1-5 |
|---|---|---|---|---|---|
| OPERATION | RESET | PRECHARGE | CELL 1 | CELL 2 | CELL 3 | CELL 4 |

Fig. 16

| CYCLIC PERIOD | FIRST CYCLE | | | | | | | SECOND CYCLE | | | | | | | THIRD CYCLE | | | | | | |
|---|---|---|---|---|---|---|---|---|---|---|---|---|---|---|---|---|---|---|---|---|---|
| SLOT | 1 | 2 | 3 | 4 | 5 | 6 | 7 | 1 | 2 | 3 | 4 | 5 | 6 | 7 | 1 | 2 | 3 | 4 | 5 | 6 | 7 |
| SELECTION TARGET | – | PRECHARGE | CELL 1 | CELL 2 | CELL 3 | CELL 4 | CELL 5 | PRECHARGE | CELL 3 | CELL 4 | CELL 5 | PRECHARGE | CELL 1 | CELL 2 | PRECHARGE | CELL 5 | PRECHARGE | CELL 1 | CELL 2 | CELL 3 | CELL 4 |

| SLOT | 2-1 | 2-2 |
|---|---|---|
| OPERATION | PRECHARGE CELL 4 | CELL 2 |

| SLOT | 1-1 |
|---|---|
| OPERATION | PRECHARGE CELL 4 |

| SLOT | 5-1 | 5-2 |
|---|---|---|
| OPERATION | PRECHARGE CELL 4 | CELL 2 |

| SLOT | 1-1 |
|---|---|
| OPERATION | PRECHARGE CELL 4 |

| SLOT | 3-1 | 3-2 |
|---|---|---|
| OPERATION | PRECHARGE CELL 4 | CELL 2 |

Fig.22

| CYCLIC PERIOD | FIRST CYCLE | | | | | | | SECOND CYCLE | | | | | | | THIRD CYCLE | | | | | | |
|---|---|---|---|---|---|---|---|---|---|---|---|---|---|---|---|---|---|---|---|---|---|
| SLOT | 1 | 2 | 3 | 4 | 5 | 6 | 7 | 1 | 2 | 3 | 4 | 5 | 6 | 7 | 1 | 2 | 3 | 4 | 5 | 6 | 7 |
| SELECTION TARGET | RESET | CELL 1 | CELL 2 | CELL 3 | CELL 4 | CELL 5 | MONITOR VOLTAGE | RESET | CELL 1 | CELL 2 | CELL 3 | CELL 4 | CELL 5 | MONITOR VOLTAGE | RESET | CELL 1 | CELL 2 | CELL 3 | CELL 4 | CELL 5 | MONITOR VOLTAGE |

Fig.24A

| CYCLIC PERIOD | FIRST CYCLE | | | | | | | | SECOND CYCLE | | | | | | | | THIRD CYCLE | | | | | | | |
|---|---|---|---|---|---|---|---|---|---|---|---|---|---|---|---|---|---|---|---|---|---|---|---|
| SLOT | 1 | 2 | 3 | 4 | 5 | 6 | 7 | 8 | 1 | 2 | 3 | 4 | 5 | 6 | 7 | 8 | 1 | 2 | 3 | 4 | 5 | 6 | 7 | 8 |
| SELECTION TARGET | — | RESET | CELL 1 | CELL 2 | CELL 3 | CELL 4 | CELL 5 | MONITOR VOLTAGE | RESET | CELL 3 | CELL 4 | CELL 5 | MONITOR VOLTAGE | RESET | CELL 1 | CELL 2 | RESET | CELL 5 | MONITOR VOLTAGE | RESET | CELL 1 | CELL 2 | CELL 3 | CELL 4 |

Fig.24B

| CYCLIC PERIOD | FIRST CYCLE | | | | | | | | SECOND CYCLE | | | | | | | | THIRD CYCLE | | | | | | | |
|---|---|---|---|---|---|---|---|---|---|---|---|---|---|---|---|---|---|---|---|---|---|---|---|---|
| SLOT | 1 | 2 | 3 | 4 | 5 | 6 | 7 | 8 | 1 | 2 | 3 | 4 | 5 | 6 | 7 | 8 | 1 | 2 | 3 | 4 | 5 | 6 | 7 | 8 |
| SELECTION TARGET | – | RESET | CELL 1 | CELL 2 | CELL 3 | CELL 4 | CELL 5 | MONITOR VOLTAGE | PRECHARGE + RESET | CELL 3 | CELL 4 | CELL 5 | MONITOR VOLTAGE | RESET | CELL 1 | CELL 2 | PRECHARGE + RESET | CELL 5 | MONITOR VOLTAGE | RESET | CELL 1 | CELL 2 | CELL 3 | CELL 4 |

Fig.24C

| CYCLIC PERIOD | FIRST CYCLE | | | | | | | | SECOND CYCLE | | | | | | | | THIRD CYCLE | | | | | | | |
|---|---|---|---|---|---|---|---|---|---|---|---|---|---|---|---|---|---|---|---|---|---|---|---|---|
| SLOT | 1 | 2 | 3 | 4 | 5 | 6 | 7 | 8 | 1 | 2 | 3 | 4 | 5 | 6 | 7 | 8 | 1 | 2 | 3 | 4 | 5 | 6 | 7 | 8 |
| SELECTION TARGET | - | PRECHARGE | CELL 1 | CELL 2 | CELL 3 | CELL 4 | CELL 5 | MONITOR VOLTAGE | PRECHARGE | CELL 3 | CELL 4 | CELL 5 | MONITOR VOLTAGE | PRECHARGE | CELL 1 | CELL 2 | PRECHARGE | CELL 5 | MONITOR VOLTAGE | PRECHARGE | CELL 1 | CELL 2 | CELL 3 | CELL 4 |

Fig.25

| CYCLIC PERIOD | FIRST CYCLE | | | | | | | SECOND CYCLE | | | | | | | THIRD CYCLE | | | | | | |
|---|---|---|---|---|---|---|---|---|---|---|---|---|---|---|---|---|---|---|---|---|---|
| SLOT | 1 | 2 | 3 | 4 | 5 | 6 | 7 | 1 | 2 | 3 | 4 | 5 | 6 | 7 | 1 | 2 | 3 | 4 | 5 | 6 | 7 |
| SELECTION TARGET (CELL VOLTAGE SYSTEM) | — | PRECHARGE | CELL 1 | CELL 2 | CELL 3 | CELL 4 | CELL 5 | PRECHARGE | CELL 3 | CELL 4 | CELL 5 | PRECHARGE | CELL 1 | CELL 2 | PRECHARGE | CELL 5 | PRECHARGE | CELL 1 | CELL 2 | CELL 3 | CELL 4 |
| SELECTION TARGET (MONITOR VOLTAGE SYSTEM) | — | MONITOR VOLTAGE | — | — | — | — | — | — | — | — | — | MONITOR VOLTAGE | — | — | — | — | MONITOR VOLTAGE | — | — | — | — |

Fig.27

| REMAINDER VALUE | START CELL NUMBER |
|---|---|
| 4 | 5 |
| 3 | 4 |
| 2 | 3 |
| 1 | 2 |
| 0 | 1 |

VOLTAGE DETECTION CIRCUIT MEASUREMENT APPARATUS FOR USE IN ASSEMBLED BATTERY SYSTEM

CROSS-REFERENCE OF RELATED APPLICATIONS

This application is the U.S. National Phase under 35 U.S.C. § 371 of International Patent Application No. PCT/JP2018/031832, filed Aug. 28, 2018, which in turn claims the benefit of Japanese Application No. 2017-164273, filed on Aug. 29, 2017, the entire disclosures of which Applications are incorporated by reference herein.

TECHNICAL FIELD

The present invention relates to a voltage detection circuit, a voltage measurement apparatus, an assembled battery system, and a voltage measurement method.

BACKGROUND ART

FIG. 1 is a block diagram showing a configuration of an assembled battery system 100 according to a conventional example. In addition, FIG. 2 is a block diagram showing a configuration of a voltage detection circuit 10A of FIG. 1, and FIG. 3 is a diagram showing an analog-to-digital (AD) conversion sequence executed by the voltage detection circuit 10A of FIG. 2.

Referring to FIG. 1, the voltage detection circuit 10A is a circuit that is mounted in the assembled battery system 100, and measures a plurality of cell voltages of a plurality of battery cells (hereinafter, referred to as cells) 1 to 5 configuring an assembled battery 101. The assembled battery 101 is configured by connecting the plurality of cells 1 to 5 in series. The cell voltages of the respective electrodes of the plurality of cells 1 to 5 are inputted into the voltage detection circuit 10A via voltage detection lines LG and L0 to L5 and the filter circuit 102. Each of the cell voltages converted to digital data by the voltage detection circuit 10A is transmitted to a micro control unit (MCU) 103, which is an apparatus controller. In this case, the filter circuit 102 includes a plurality of resistors R0 and capacitors C10 to C15, and is formed of, for example, six RC type low pass filters. CG, C0 to C5, CS0 to CS5 are terminals for connecting respective circuits.

Referring to FIG. 2, the voltage detection circuit 10A includes a multiplexer (hereinafter, also referred to as a MUX) 11, an analog-to-digital converter (ADC) 12, a decoder 13, a register 14, an interface (I/F) 15, and a control circuit 20 having a sequencer 21. In this case, the MUX 11 is configured to include switches SW1 to SW52.

As shown in FIG. 3, the voltage detection circuit 10A of the conventional example selectively operates the MUX 11 sequentially from the lowest cell in a group with a fixed period to sequentially AD-convert the cell voltages. The example of the sequence of FIG. 3 shows the operation of initializing the output voltage of the MUX 11 to a voltage potential of the lowest cell and then selecting the cells by the MUX 11 in the order of 1→2→3→4→5 to perform the AD conversion. "Reset" means the operation of initializing the output of the MUX 11 to a predetermined voltage potential (such as ground voltage potential GND) before the start of measurement of the cells. Measurement of a cell n is to measure a voltage between terminals CSn and CSn−1. For example, in the case of the voltage of the cell 1, a voltage between the terminals CS1 and CS0 is measured.

PRIOR ART DOCUMENT

Patent Document

[Patent Document 1] Japanese Patent No. JP5492044B2

SUMMARY OF THE INVENTION

Problems to be Solved by the Invention

In the configuration in which the operation is performed with a fixed period in a manner similar to that of the conventional example, when disturbance noise at a frequency equal to or higher than one-half of the frequency corresponding to the fixed period is superimposed on the cell input terminal, the disturbance noise is folded to a low frequency (called aliasing) during the AD conversion to cause deterioration in voltage measurement accuracy.

FIG. 6A shows an attenuation frequency characteristic of input noise in the case of the fixed period of 2 kHz in the conventional example. As is apparent from FIG. 6A, the attenuation characteristic deteriorates at 1 kHz or higher.

An object of the present invention is to reduce aliasing by changing the order of cell selection by a MUX to eliminate the periodicity of the AD conversion in an assembled battery configured by connecting a plurality of cells in series.

Means for Dissolving the Problems

According to one aspect of the present invention, there is provided a voltage detection circuit for measuring a plurality of cell voltages of an assembled battery configured by connecting a plurality of cells in series. The voltage detection circuit includes a plurality of input terminals connected to respective electrodes of the plurality of cells through a plurality of voltage detection lines; a multiplexer that periodically selects and outputs voltages of a plurality of cells in a group, a plurality of series cells configured as the group; an analog-to-digital (AD) converter that AD-converts an output voltage from the multiplexer and outputs digital data of the output voltage; and a control circuit that controls a timing for the selection by the multiplexer and a timing for the AD conversion. The control circuit switches over a time interval for which the multiplexer selects each of the cells to change a period of the AD conversion.

Effect of the Invention

According to the voltage detection circuit of the present invention, in the assembled battery configured by connecting the plurality of cells in series, it is possible to reduce aliasing by changing the order of cell selection by the MUX to eliminate the periodicity of the AD conversion.

BRIEF DESCRIPTION OF THE DRAWINGS

FIG. 3 is a diagram showing an AD conversion sequence executed by the voltage detection circuit of FIG. 2.

FIG. 5 is a diagram showing an example of an AD conversion sequence executed by the voltage detection circuit 10B of FIG. 4B.

FIG. 9 is a diagram showing an example of an AD conversion sequence according to Embodiment 2-1.

FIG. 10 is a diagram showing an example of an AD conversion sequence according to Embodiment 2-2.

FIG. 11 is a diagram showing an example of an AD conversion sequence according to Embodiment 2-3.

FIG. 12 is a diagram showing an example of an AD conversion sequence according to Embodiment 2-4.

FIG. 14 is a diagram showing an example of an AD conversion sequence according to Embodiment 2-6.

FIG. 16 is a diagram showing an example of an AD conversion sequence according to Embodiment 3-2.

FIG. 22 is a diagram showing an AD conversion sequence according to the conventional example.

FIG. 24A is a diagram showing an example of an AD conversion sequence according to Embodiment 5-1, the diagram showing the case of Embodiment 5-1-1 where monitor voltage measurement is performed.

FIG. 24B is a diagram showing an example of the AD conversion sequence according to Embodiment 5-1, the diagram showing the case of Embodiment 5-1-2 where monitor voltage measurement is performed.

FIG. 24C is a diagram showing an example of the AD conversion sequence according to Embodiment 5-1, the diagram showing the case of Embodiment 5-1-3 where monitor voltage measurement is performed.

FIG. 25 is a diagram showing an example of an AD conversion sequence according to Embodiment 5-2.

FIG. 27 is a table showing the relationship between a remainder value and a start cell number of a remainder calculator 202 of FIG. 26.

MODE FOR CARRYING OUT THE INVENTION

Figure 1:
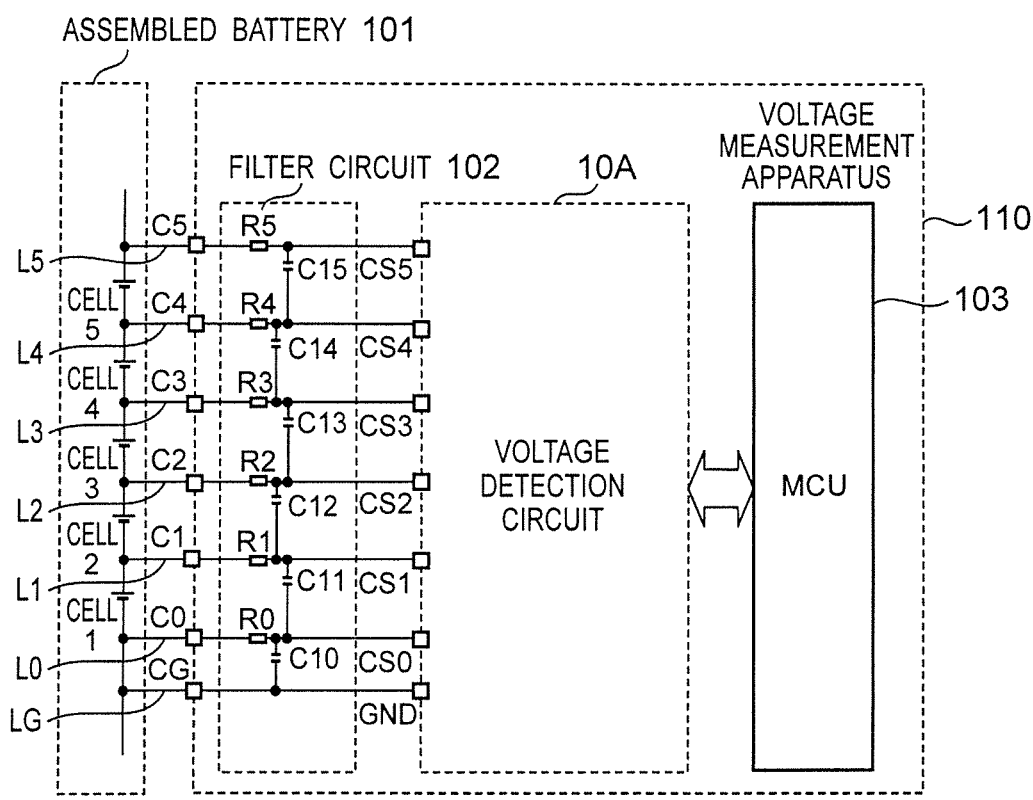
FIG. 1 is a block diagram showing a configuration of an assembled battery system 100 according to a conventional example.

Hereinafter, embodiments of the present invention will be described. In the drawings, the same or similar constituent elements will be provided with the same reference numerals, and the detailed description thereof will be omitted.

Embodiment 1

Figure 4A:
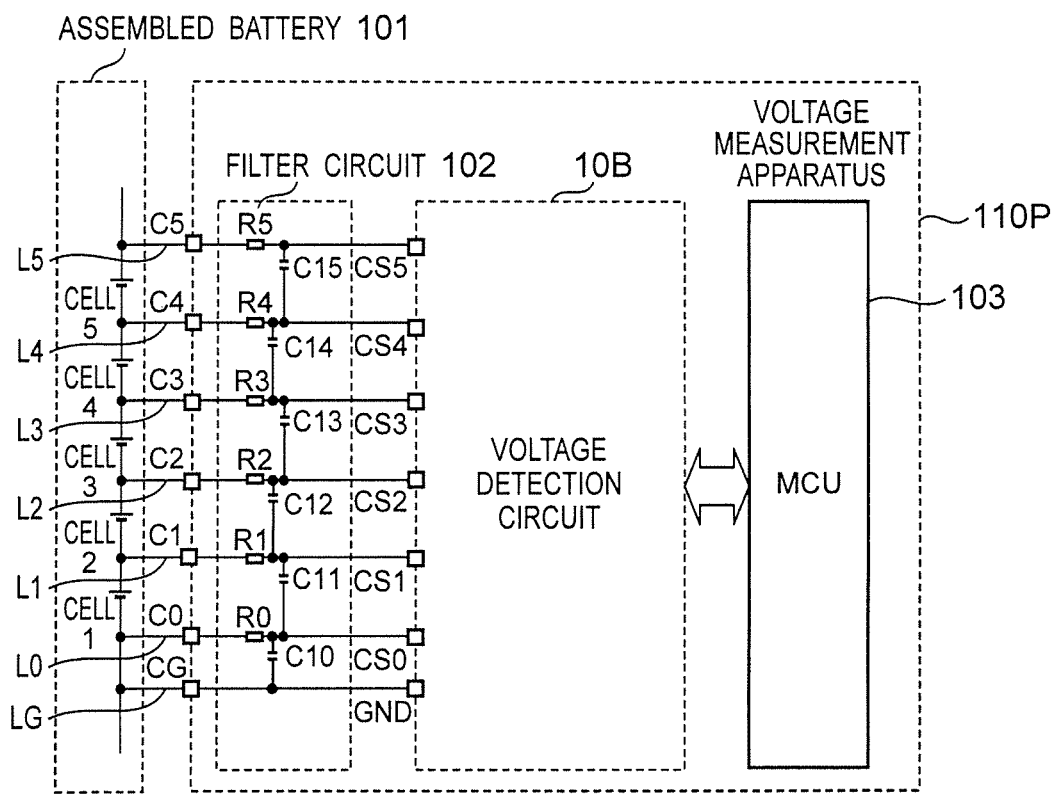
FIG. 4A is a block diagram showing a configuration example of an assembled battery system 100P according to Embodiment 1.
Figure 4B:
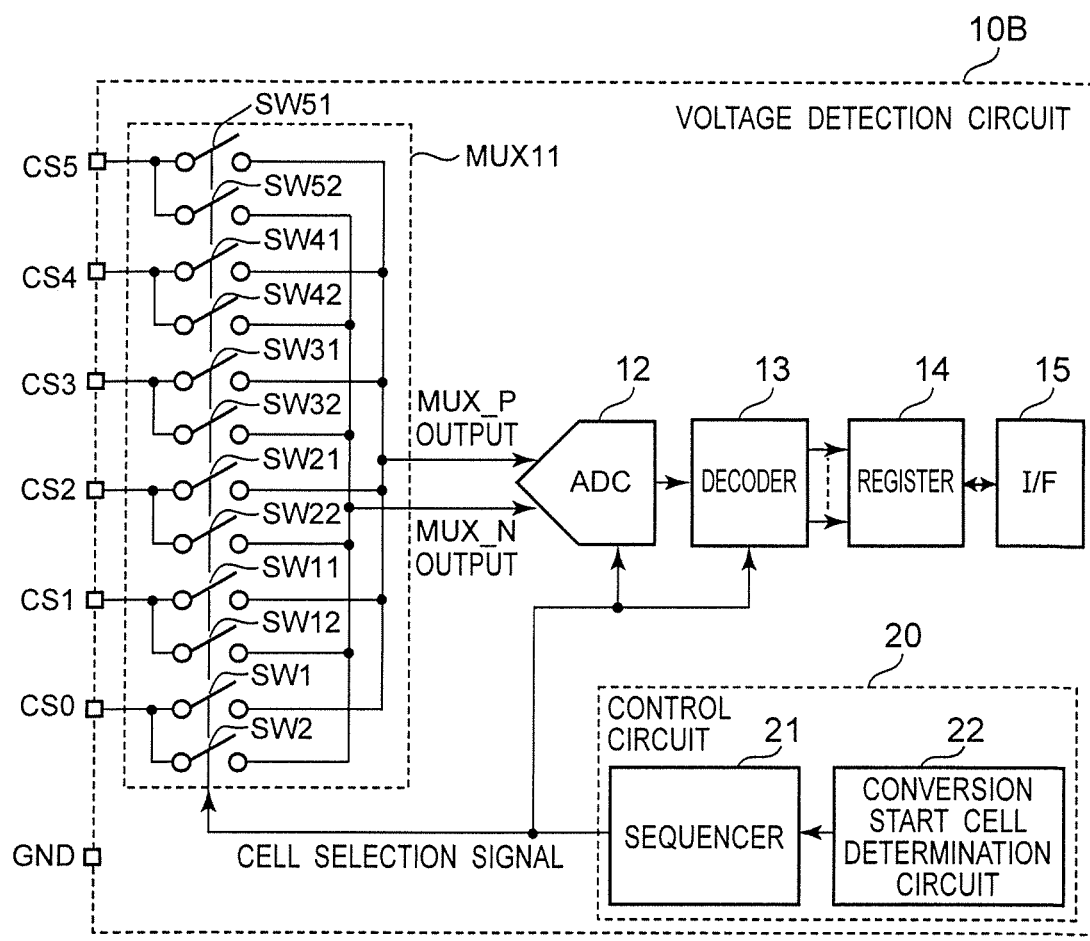
FIG. 4B is a block diagram showing a configuration example of a voltage detection circuit 10B of FIG. 4A.

FIG. 4A is a block diagram showing a configuration example of an assembled battery system 100P according to Embodiment 1, and FIG. 4B is a block diagram showing a configuration example of a voltage detection circuit 10B of FIG. 4A. In addition, FIG. 5 is a diagram showing an example of an AD conversion sequence executed by the voltage detection circuit 10B of FIG. 4B. The assembled battery system 100P of FIG. 4A is configured to include an assembled battery 101 and a voltage measurement apparatus 110P. As compared to the voltage measurement apparatus 110 of FIG. 1, the voltage measurement apparatus 110P is configured to include the voltage detection circuit 10B in place of the voltage detection circuit 10A. In addition, as compared to the voltage detection circuit 10A of FIG. 2, the voltage detection circuit 10B of FIG. 4B is characterized in that a control circuit 20 further includes a conversion start cell determination circuit 22.

Referring to FIG. 4A, the voltage detection circuit 10B is a circuit that is mounted in the assembled battery system 100P and measures a plurality of cell voltages of a plurality of cells 1 to 5 configuring the assembled battery 101. The assembled battery 101 is configured by connecting the plurality of cells 1 to 5 in series. The cell voltages of the respective electrodes of the plurality of cells 1 to 5 are inputted into the voltage detection circuit 10B via voltage detection lines LG and L0 to L5 and the filter circuit 102. Each of the cell voltages converted to digital data by the voltage detection circuit 10B is transmitted to an MCU 103, which is an apparatus controller. The MCU 103 receives and stores each of the cell voltages. In this case, the filter circuit 102 includes a plurality of resistors R0 and capacitors C10 to C15, and is formed of, for example, six RC type low pass filters. CG, C0 to C5, CS0 to CS5 are terminals for connecting each circuit.

Referring to FIG. 4B, the voltage detection circuit 10B includes a MUX 11, an analog-to-digital converter (ADC) 12, a decoder 13, a register 14, an interface (I/F) 15, and the control circuit 20 having a sequencer 21 and the conversion start cell determination circuit 22. In this case, the multiplexer 11 is configured to include switches SW1 to SW52. Based on a cell selection signal from the sequencer 21 of the control circuit 20, the multiplexer 11 periodically selects and outputs voltages of a plurality of cells in a group, where a plurality of series cells connected to the multiplexer 11 is configured as the group. It is noted that the cell selection signal from the sequencer 21 of the control circuit 20 is also inputted into the AD converter 12 and the decoder 13 and used as a timing signal for cell selection.

The voltage detection circuit 10B according to the present embodiment is characterized in that the control circuit 20 further includes the conversion start cell determination circuit 22 for determining a conversion start cell for each cyclic period of FIG. 3, and outputting the determined cell to the sequencer 21. The sequencer 21 of the control circuit 20 generates a cell selection signal based on the conversion start cell determined by the conversion start cell determination circuit 22, and outputs the generated signal to the MUX 11 and the decoder 13.

Using the switches SW1 to SW52, the MUX 11 selects two predetermined cell voltages from the plurality of cell voltages based on the cell selection signal, and outputs the selected voltages to the AD converter 12 as a differential voltage of a positive output voltage (MUX_P output) and a negative output voltage (MUX_N output). At the timing of the cell selection signal, the AD converter 12 AD-converts the output differential voltage, which has been inputted, and outputs the digital data of the output differential voltage to the decoder 13. At the timing of the cell selection signal, the decoder 13 encodes the digital data from the AD converter 12 by a predetermined encoding method and stores the encoded digital data into the register 14. The digital data of each of the cell voltages stored into the register 14 is transmitted to the MCU 103 via the interface (I/F) 15 and stored.

In Embodiment 1 of the present invention, as shown in FIG. 5, by controlling the order of selection by the MUX 11 such that the conversion start cell is switched over in each cyclic period, the time interval for the AD conversion of each cell is changed. In the sequence example of FIG. 5, the MUX 11 selects the cells in the order of:
the first cycle: cell 1→2→3→4→5;
the second cycle: cell 3→4→5→1→2; and
the third cycle: cell 5→1→2→3→4.
Then, the AD conversion is performed. In this case, "reset" means the operation of initializing the output of the MUX 11 to a predetermined voltage potential (CS0 voltage potential, GND voltage potential, or the like) before the start of measurement of the cells, but this is not indispensable.

As described above, according to Embodiment 1 of the present invention, the aliasing can be reduced by changing the order of cell selection by the MUX 11 to eliminate the periodicity of the AD conversion.

Figure 6A:
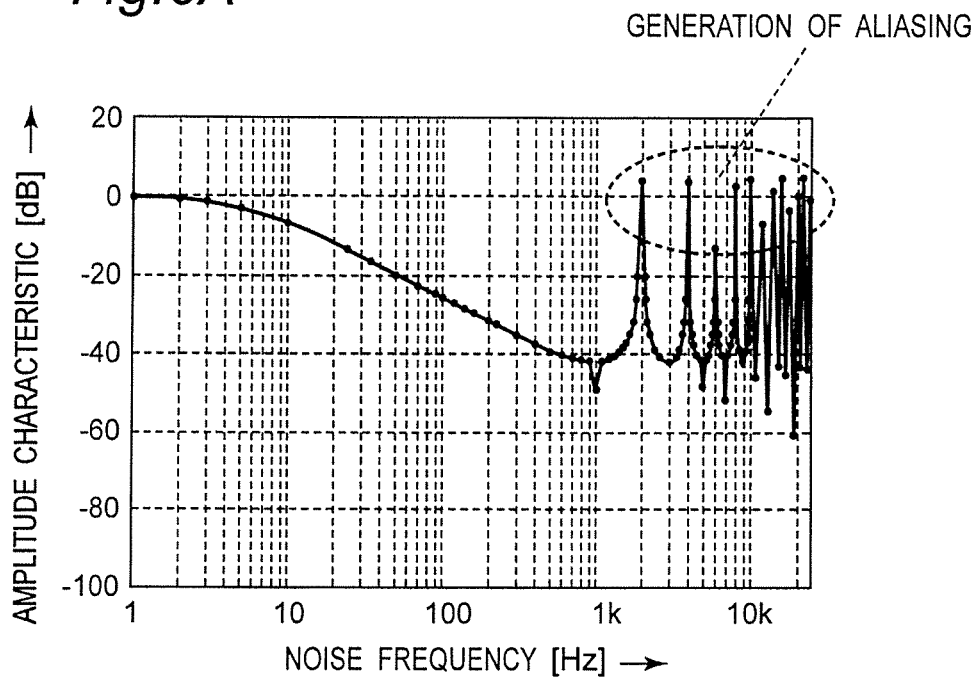
FIG. 6A is a spectrum diagram showing an attenuation characteristic of input noise of the conventional example.
Figure 6B:
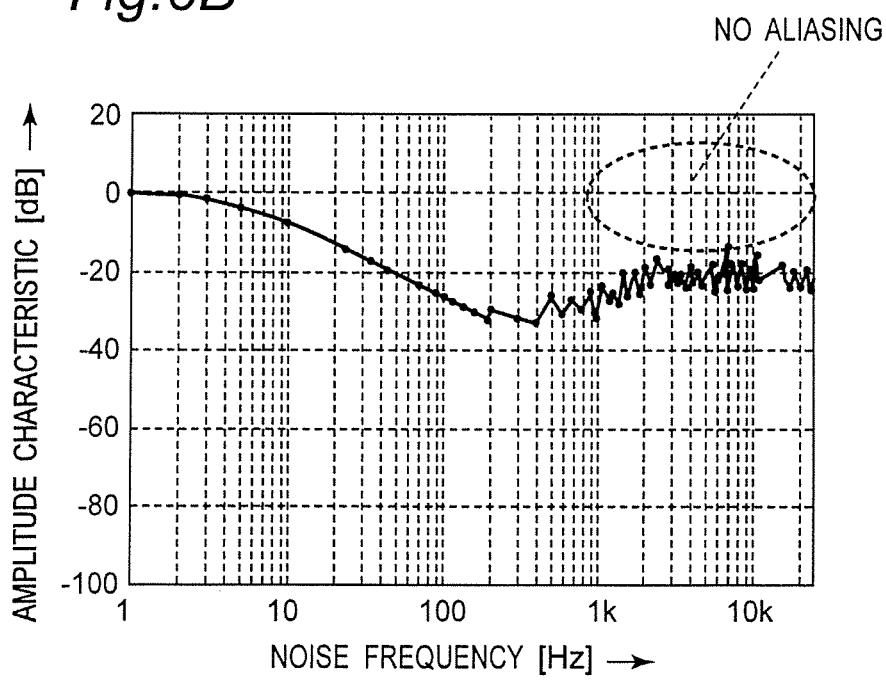
FIG. 6B is a spectrum diagram showing an attenuation characteristic of input noise of the embodiments.

FIG. 6B shows an attenuation frequency characteristic of input noise in the case of the fixed period of 2 kHz in the present embodiment. The conversion start cell determination circuit includes a linear feedback shift register described later. It can be seen that the attenuation characteristic at 1 kHz or higher greatly improves as compared to the characteristic of the configuration of the conventional example (FIG. 6A).

Embodiment 2

Figure 7A:
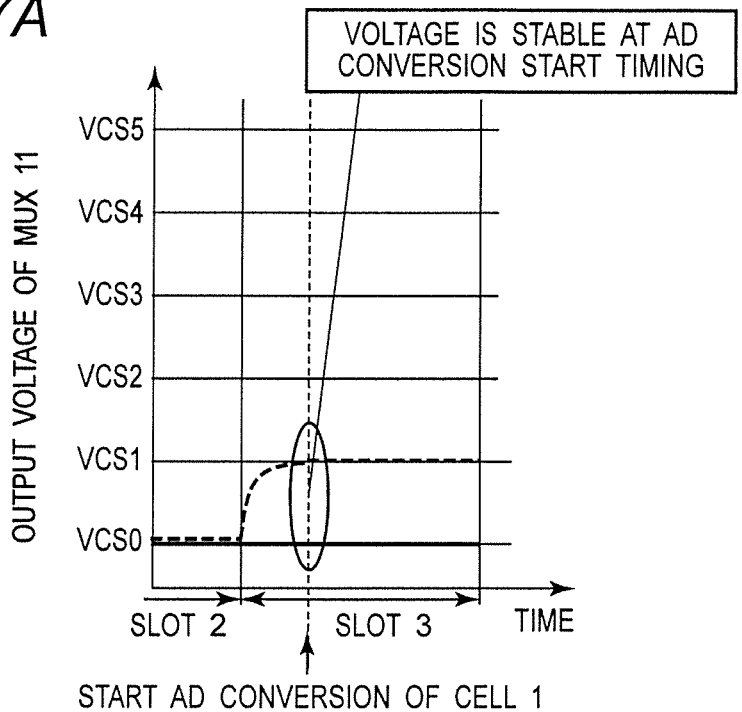
FIG. 7A is a graph showing a response characteristic of an output voltage of a multiplexer 11 of a voltage detection circuit 10B according to Embodiment 2, where the response characteristic is at the slots 2 and 3 for the first cycle when a voltage potential difference is the voltage of one cell.
Figure 7B:
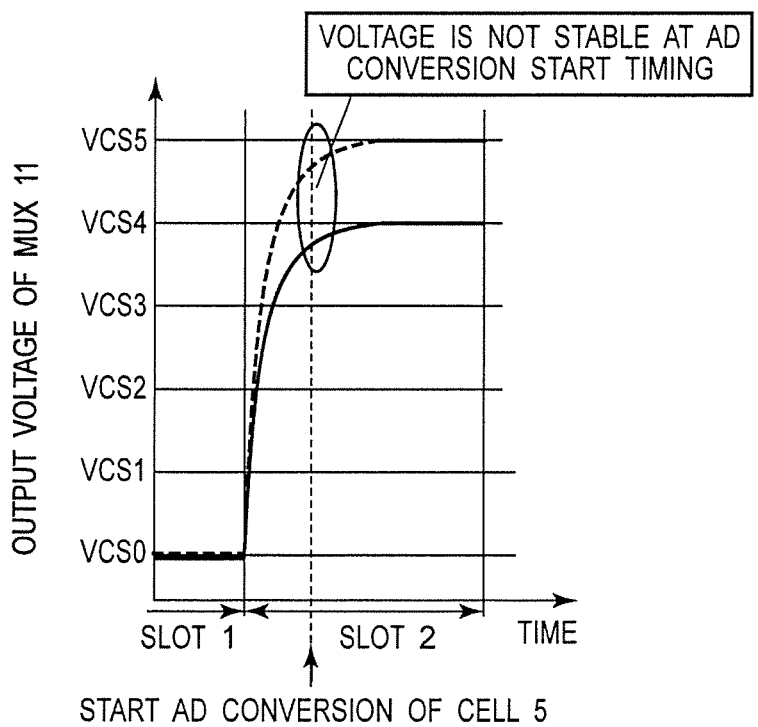
FIG. 7B is a graph showing a response characteristic of an output voltage of the multiplexer 11 of the voltage detection circuit 10B according to Embodiment 2, where the response characteristic is at the slots 1 and 2 for the third cycle when a voltage potential difference is the voltage of five cells.

FIGS. 7A and 7B each show a response characteristic of an output voltage of a multiplexer 11 in a voltage detection circuit 10B according to Embodiment 2. FIG. 7A is a response characteristic at the slots 2 and 3 for the first cycle when the voltage potential difference is the voltage of one cell. FIG. 7B is a response characteristic at the slots 1 and 2 for the third cycle when the voltage potential difference is the voltage of five cells.

When the conversion start cell is changed, the voltage potential difference between the slots becomes one or more cells. For example, in the case of the sequence of the conventional example shown in FIG. 3, with the operation starting with the cell 1 each time after the reset, the voltage potential difference between the slots is always the voltage of one cell. However, in the sequence of the embodiment of FIG. 5, the voltage potential difference between the reset state and the conversion start cell selection time becomes the voltage of one cell for the first cycle, the voltage of three cells for the second cycle, and the voltage of five cells for the third cycle, respectively. As a result, it is necessary to consider the following two problems.

(1) Influence on Response Time of MUX 11

The output response time at the turning-on or turning-off of the switches of the MUX 11 is determined by resistance when the switches configuring the MUX 11 turn on, an output load capacity, and the like. Therefore, the larger the input-output voltage potential difference of the MUX is immediately after the switch-on, the more response time is required for stabilizing the output voltage of the MUX 11. Therefore, when the conversion start cell is changed, the response time required by the MUX 11 also changes depending on the conversion start cell. As shown in FIGS. 7A and 7B, for example, when the voltage potential difference between the slots is the voltage of one cell in one case and the voltage of five cells in the other case, for example, the required transition time between those cases also differs by about 5 times. As a result, for the conversion start cell, the output voltage of the MUX 11 may not be stabilized within a predetermined conversion time and the voltage measurement accuracy may deteriorate.

(2) Influence on Input Current

Figure 8:
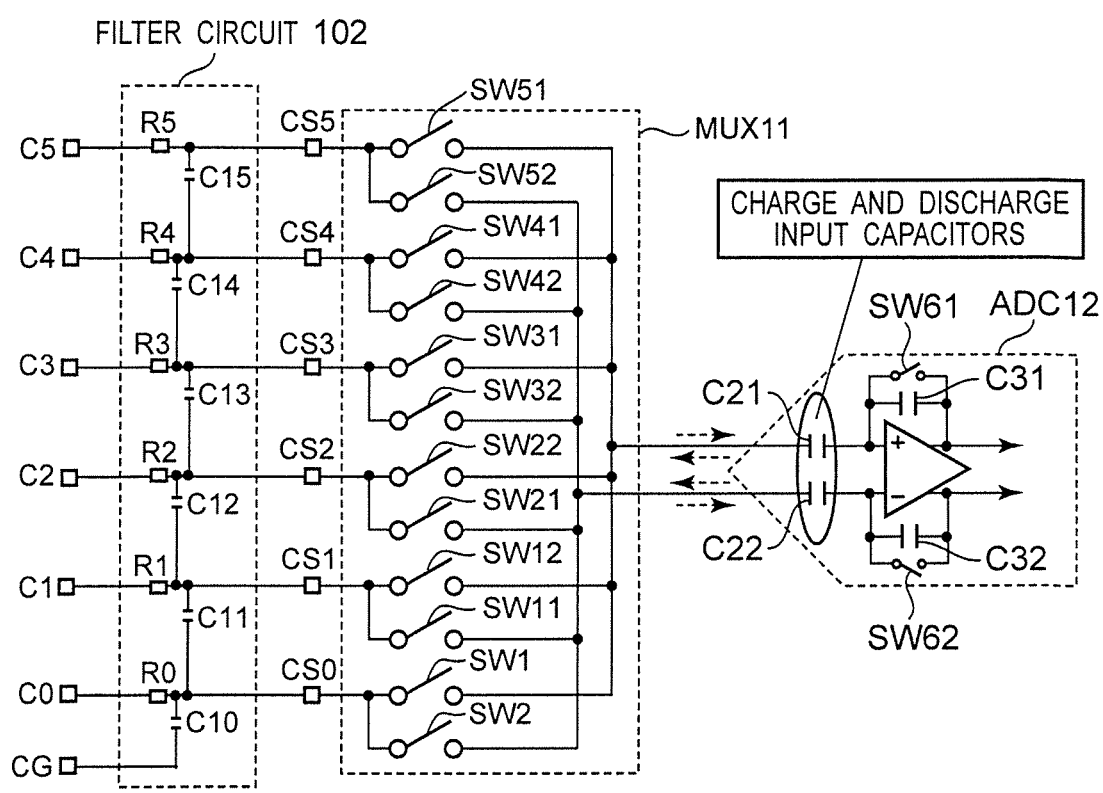
FIG. 8 is a block diagram of the multiplexer 11 and the like for explaining an input current in the voltage detection circuit 10B according to Embodiment 2.

FIG. 8 is a block diagram of the multiplexer 11 and the like for explaining the input current in the voltage detection circuit 10B according to Embodiment 2.

When the switch of the MUX 11 turns on and the output of the MUX 11 responds, in order to charge and discharge input capacitors, such as capacitors C21, C22, of an AD converter 12, a current (input current) is drawn in from an input terminal. The larger the input and output voltage potential difference of the MUX 11 is, the larger the input current becomes. When the input current becomes larger, a voltage drop occurs due to resistors R0 to R5 of a filter circuit 102 connected to the input terminal, so that the voltage measurement accuracy deteriorates. Referring to FIG. 8, SW61 and C31, and SW62 and C32 are switches and capacitors used for a feedback circuit of the AD converter 12.

Figure 13:
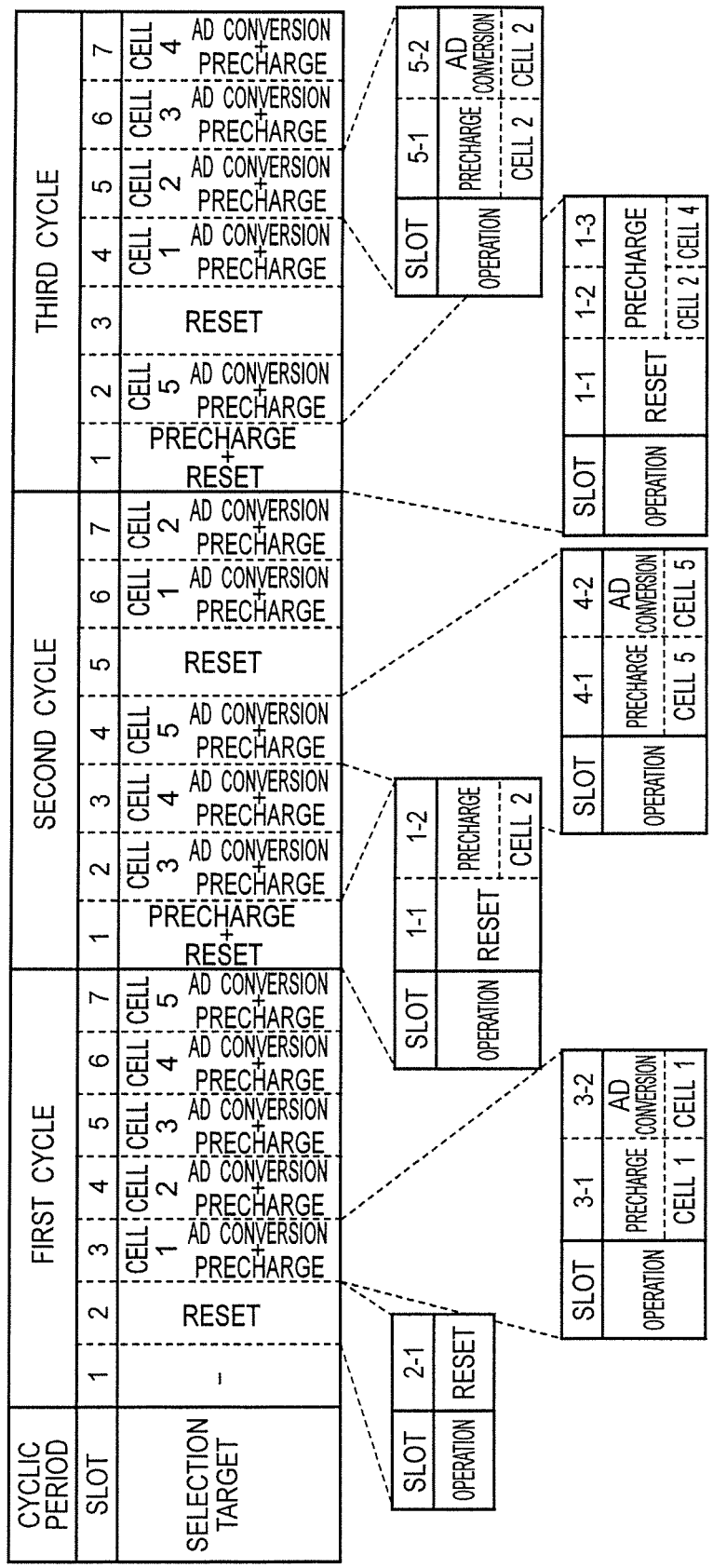
FIG. 13 is a diagram showing an example of an AD conversion sequence according to Embodiment 2-5.

FIG. 9 is a diagram showing an example of an AD conversion sequence according to Embodiment 2-1, and the voltage corresponding to the immediately preceding cell may be precharged so that the transition voltage to the cell measured after the reset becomes that of one cell or less. FIG. 10 is a diagram showing an example of an AD conversion sequence according to Embodiment 2-2, and the precharge does not need to be changed at a voltage equivalent to one cell, and may be a voltage equivalent to two cells, for example. FIG. 11 is a diagram showing an example of an AD conversion sequence according to Embodiment 2-3, and the transition voltage at the time of precharge may be a mixture of a voltage corresponding to one cell and a voltage corresponding to two cells. FIG. 12 is a diagram showing an example of an AD conversion sequence according to Embodiment 2-4, and the precharge voltage may be the voltage of the conversion start cell itself. FIG. 13 is a diagram showing an example of an AD conversion sequence according to Embodiment 2-5, and before the measurement of each cell, the measurement may be started after precharging the cell to a voltage corresponding to the cell immediately before precharging the cell itself. FIG. 14 is a diagram showing an example of an AD conversion sequence according to Embodiment 2-6, and the number of slots per one cycle need not be fixed, namely, "-" (blank) at the start of cell 1 may not be present.

In Embodiment 2 of the present invention, when the AD conversion start cell is not the lowest cell in the group of the MUX 11,
(A) the MUX 11 first selects at least one intermediate cell so as to go through the intermediate cell, and then, selects a conversion start cell; or
(B) the MUX 11 selects the conversion start cell without going through any intermediate cell,
and the MUX 11 performs a precharge operation, and then, the MUX 11 selects a conversion target cell.

In the configuration example of FIG. 4B, the lowest cell means the cell 1, the intermediate cell(s) means the cells 2 to 4, and the highest cell means the cell 5. For example, in the case where the AD conversion start is the cell 5, as the precharge control, the MUX 11 first selects any one of the cells 1 to 5 or a plurality of cells, and then AD-converts the cell 5.

As described above, according to Embodiment 2, the transition time of the output voltage potential of the MUX 11 upon the start of the conversion, and the input current can be reduced by performing the control of first selecting intermediate cell(s) so as to go through at least one intermediate cell, and then selecting the conversion start cell. Hence, it is possible to perform accurate cell voltage measurement.

In addition, by setting the cell selected at the end of the precharge control to be one cell lower than the cell to be AD-converted after the precharge operation, an amount of fluctuation in the output voltage of the MUX 11 within a predetermined time can be unified to an amount corresponding to one cell. Therefore, it is possible to stabilize the output voltage of the MUX 11 within a predetermined conversion time and to perform highly accurate cell voltage measurement.

Embodiment 3

Figure 15:
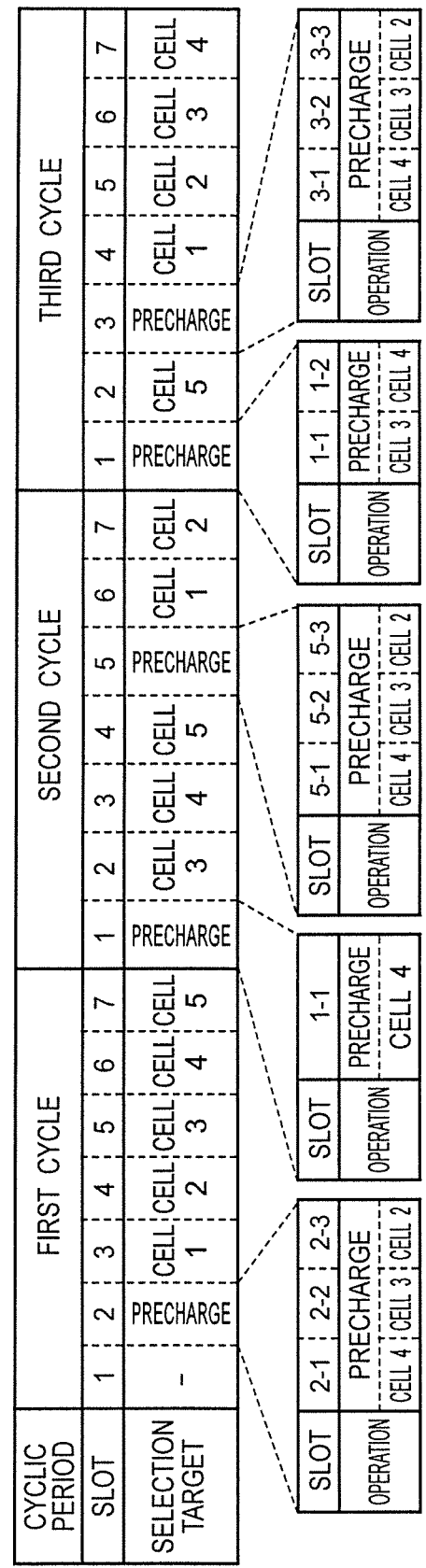
FIG. 15 is a diagram showing an example of an AD conversion sequence according to Embodiment 3-1.
Figure 17:
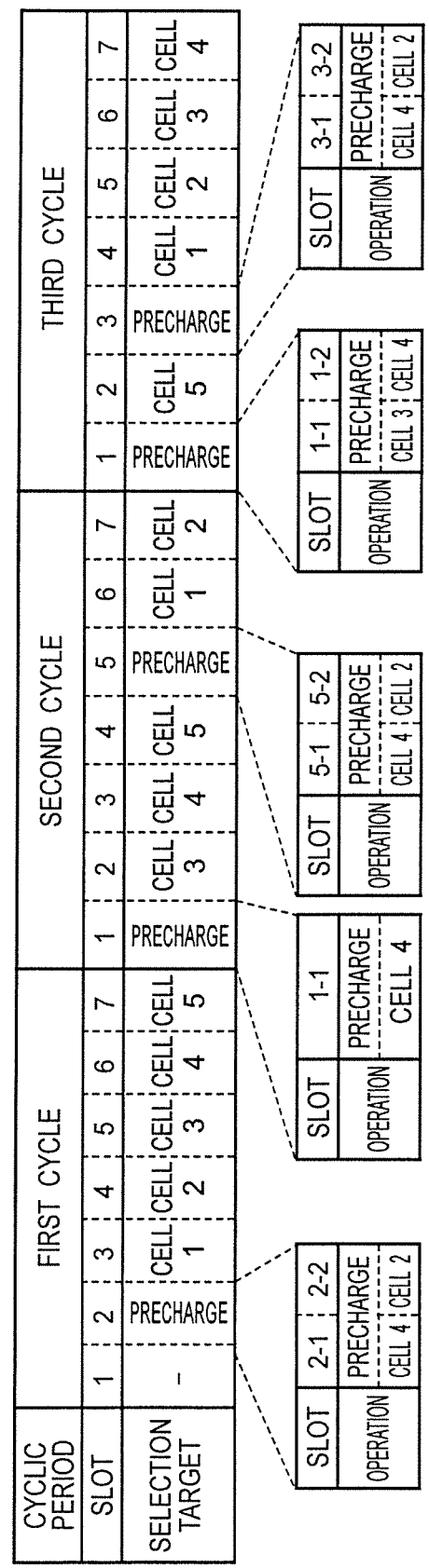
FIG. 17 is a diagram showing an example of an AD conversion sequence according to Embodiment 3-3.
Figure 18:
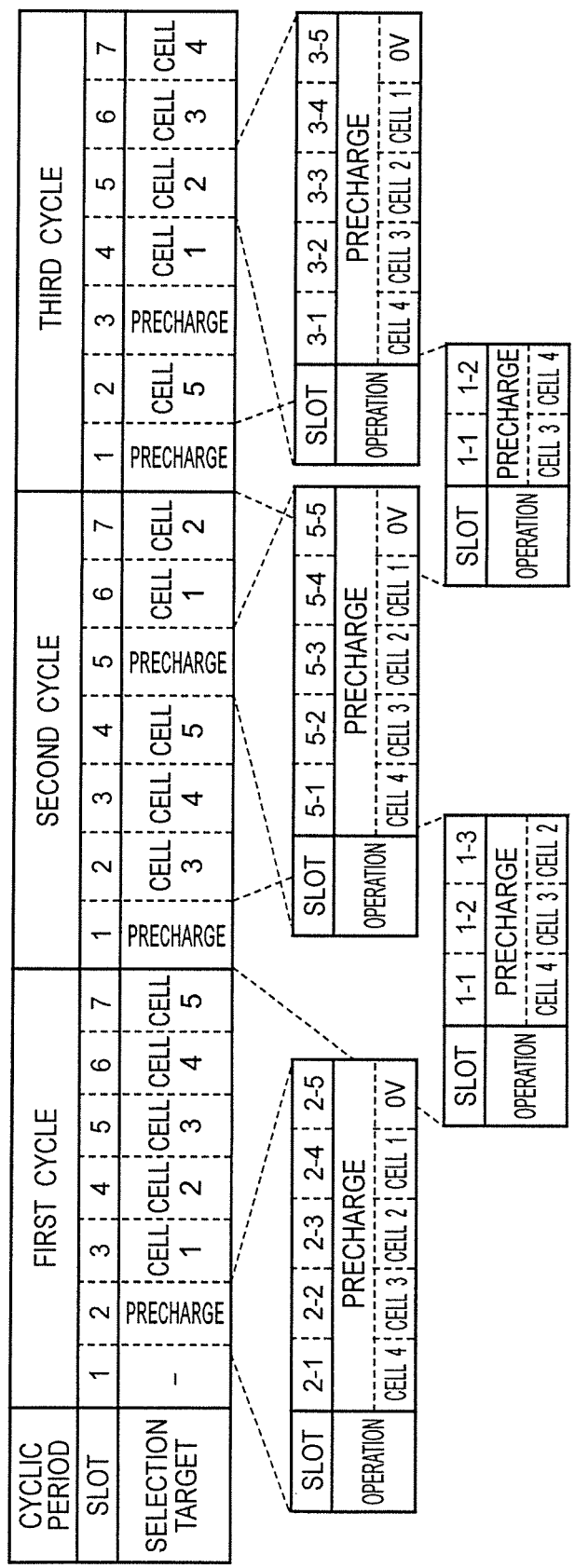
FIG. 18 is a diagram showing an example of an AD conversion sequence according to Embodiment 3-4.

FIG. 15 is a diagram showing an example of an AD conversion sequence according to Embodiment 3-1, which is an example of a case where the final conversion cell of the previous period is the cell 5 in precharge for the first cycle and the precharge is performed in the one-cell unit. FIG. 16 is a diagram showing an example of an AD conversion sequence according to Embodiment 3-2, which is an example of a case where the final conversion cell of the previous period is the cell 5 in precharge for the first cycle and the precharge is performed in the two-cell unit. FIG. 17 is a diagram showing an example of an AD conversion sequence according to Embodiment 3-3, which is an example of a case where the precharge in the one-cell unit and the precharge in the two-cell unit are mixed. FIG. 18 is a diagram showing an example of an AD conversion sequence according to Embodiment 3-4, which is an example of a case where the final conversion cell of the previous period is the cell 5 in precharge for the first cycle, and the precharge is performed by selecting the next conversion cell itself. Referring to FIG. 18, the last cell of the precharge is a cell that is one cell lower than the next conversion cell, and the reset is performed to 0 V before measurement of the cell 1.

As described in Embodiment 2 of the present invention, when the precharge operation is performed after the reset, the switch of a MUX 11 is selected more frequently in the lower cell, and therefore, the input current becomes larger in the lower cell. As a result, due to the influence of the voltage drop caused by resistors R0 to R5 of a filter circuit 102 connected to the input terminal, it becomes more difficult to perform highly accurate voltage measurement in the lower cell.

In Embodiment 3 of the present invention, when the cell to be AD-converted is separated by two or more cells,
(A) the MUX 11 first selects at least one intermediate cell which is not any next conversion cell, so as to go through the intermediate cell, and then, selects the next conversion cell; or
(B) the MUX 11 first selects the next conversion cell without going through any intermediate cell,
and the MUX 11 preforms a precharge operation, and then, selects a conversion target cell. For example, in the example shown in FIG. 15, due to the sequence of selecting the cell 3 after converting the cell 5 between the first cycle and the second cycle, the MUX 11 first selects the cell 4 and then selects the cell 3, and thereafter, the AD conversion is performed.

In this case, the intermediate cell(s) selected to be gone through may be in a unit of one cell or in a unit of a plurality of cells. For example, the one-cell unit may be used as shown in FIG. 15, or the two-cell unit may be used as shown in FIG. 16. Alternatively, as shown in FIG. 17, the number of cells in a unit need not be fixed. The number of cells in a unit may not be fixed, but may be switched over to the one-cell unit in the case of separation of two or more cells, and may be switched over to the two-cell unit in the case of separation of three or more cells.

As shown in FIG. 18, before AD conversion of the cell 1, the output of the MUX 11 is preferably initialized to the CS0 voltage potential or the GND voltage potential by the reset operation.

As described above, according to Embodiment 3, the frequency of switch selection by the MUX 11 for each cell becomes uniform, so that it is possible to reduce the deviation of the input current.

In addition, by setting the cell selected at the end of the precharge control to be one cell lower than the cell to be AD-converted after the precharge control, an amount of fluctuation in the output voltage of the MUX 11 within a predetermined time can be unified to an amount corresponding to one cell. Therefore, it is possible to stabilize the output voltage of the MUX 11 within a predetermined conversion time and to perform highly accurate cell voltage measurement. In this case, at the time of AD conversion of the cell 1, the output of the MUX is initialized to the CS0 voltage potential or the GND voltage potential by the reset operation, so that it is possible to fix the MUX output voltage at the time of measurement of the cell 1 to a voltage corresponding to one cell.

Embodiment 4

Figure 19:
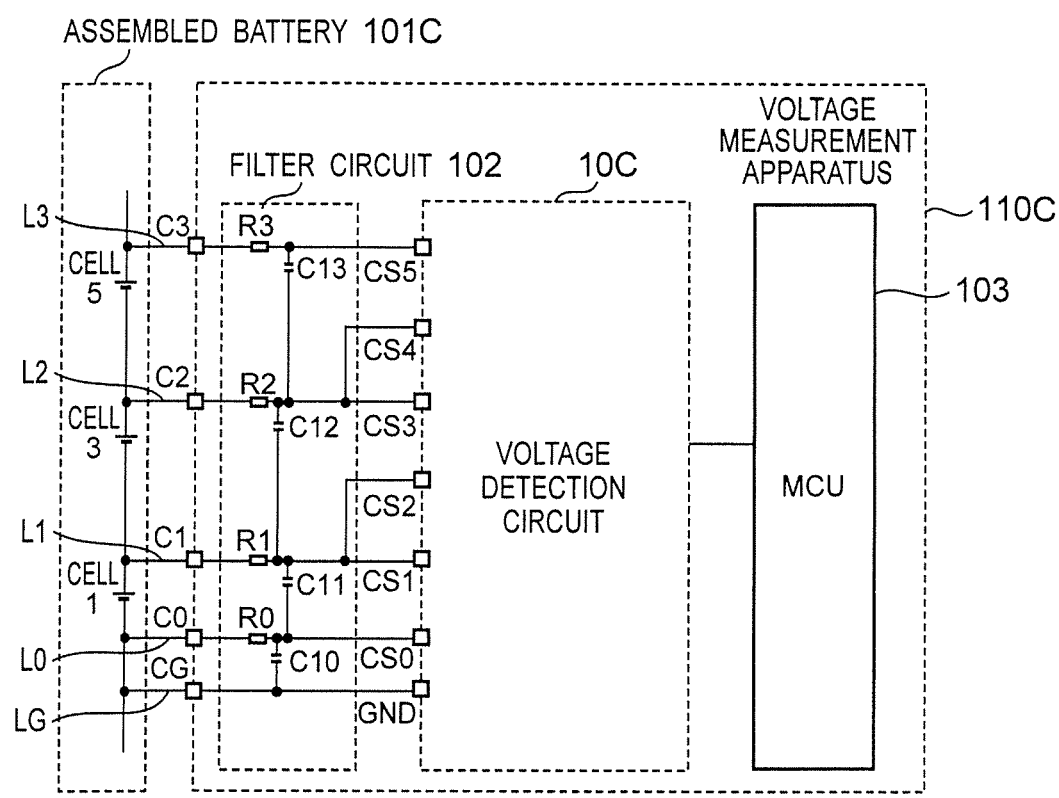
FIG. 19 is a block diagram showing a configuration example of an assembled battery system 100C according to Embodiment 4.
Figure 20:
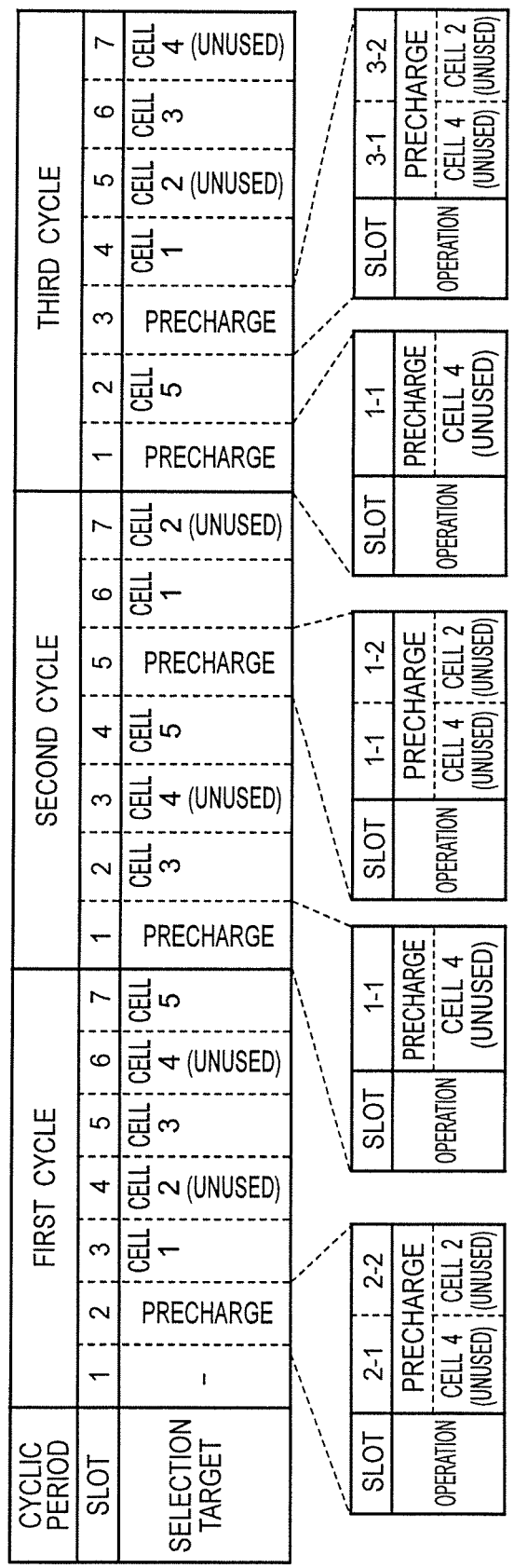
FIG. 20 is a diagram showing an example of an AD conversion sequence according to Embodiment 4.

FIG. 19 is a block diagram showing a configuration example of an assembled battery system 1000 according to Embodiment 4. FIG. 20 is a diagram showing an example of an AD conversion sequence according to Embodiment 4, in which the final conversion cell of the previous period is the cell 5 in precharge for the first cycle.

As described above, in order to enable highly accurate voltage measurement, the amount of fluctuation in the output voltage of the MUX 11 within a predetermined time is preferably unified to an amount corresponding to one cell. However, in the case of performing the precharge in the unit of two cells, when there is an unused cell, the measure needs to be devised.

FIG. 19 shows a block diagram of the assembled battery system 100C in a case where the cell 2 and the cell 4 are unused cell which do not exist. Referring to FIG. 19, the assembled battery system 100C includes an assembled battery 101C and a voltage measurement apparatus 110C. In this case, the voltage measurement apparatus 110C includes a filter circuit 102, a voltage detection circuit 10C, and an MCU 103.

In the configuration of FIG. 19, the case of operation in the AD conversion sequence shown in FIG. 10 is considered. At this time, the unused cell is excluded from the measurement target because the battery cell is not connected. However, if the unused terminal is connected to the node of the same potential not to be subjected to the precharge control, then after the resetting in the third cycle, the cell 5 is measured substantially without performing a precharge operation after resetting. As a result, the amount of fluctuation in the output voltage of the MUX 11 becomes an amount corresponding to five cells, thus making it difficult to perform highly accurate voltage measurement.

In Embodiment 4 of the present invention, even when there is an unused terminal among input terminals in a group of the MUX 11 connected to a plurality of cells, the unused terminal is taken as a target of going through selection for the precharge (a cell voltage connected to the terminal is taken as the target). FIG. 20 shows an example in which the cell 2 and the cell 4 are not used for the sequence of FIG. 16.

As described above, according to Embodiment 4, even when there is an unused cell, the amount of fluctuation in the output voltage of the MUX 11 can be made constant, thus enabling highly accurate voltage measurement.

Embodiment 5-1

Figure 21:
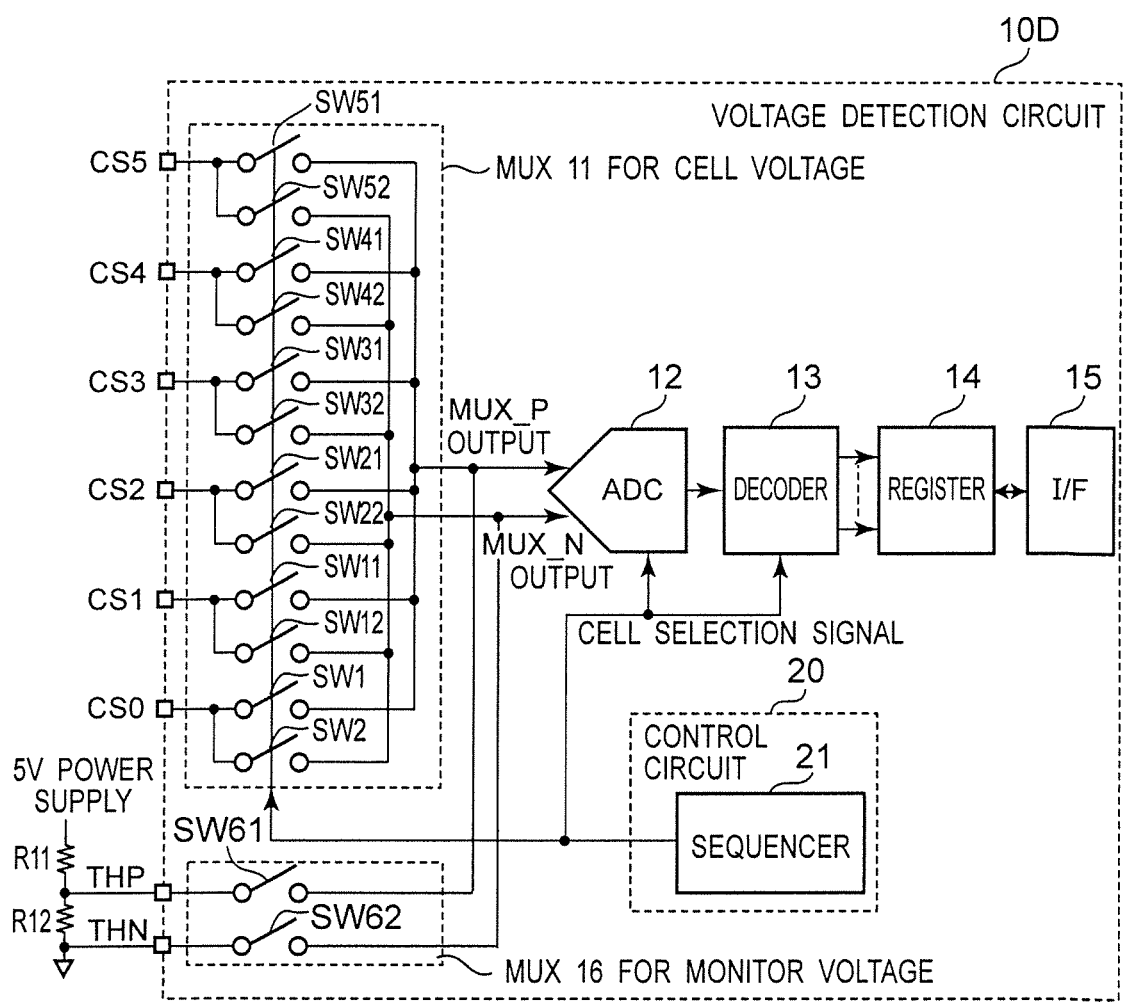
FIG. 21 is a block diagram showing a configuration example of a voltage detection circuit 10D according to the conventional example.
Figure 23:
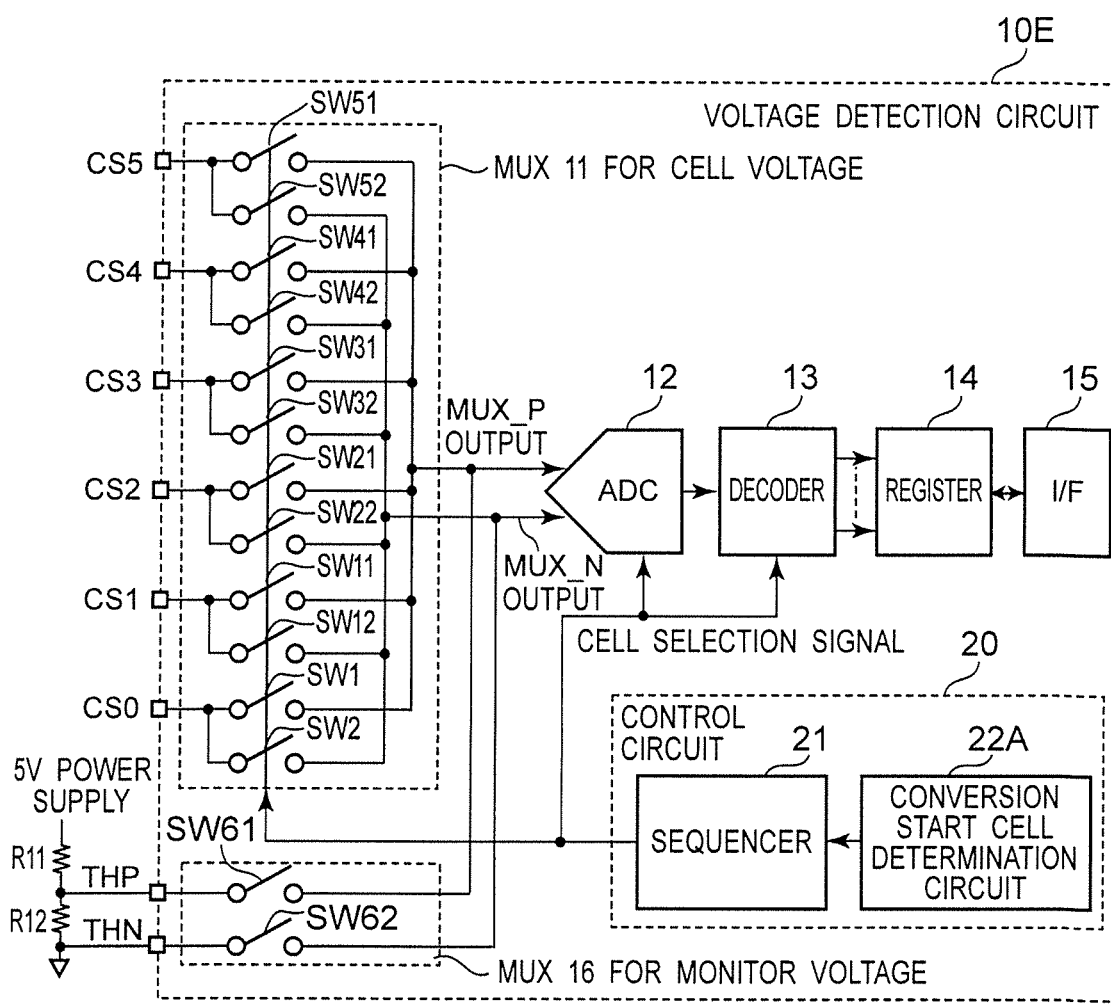
FIG. 23 is a block diagram showing a configuration example of a voltage detection circuit 10E according to Embodiment 5.

FIG. 21 is a block diagram showing a configuration example of a voltage detection circuit 10D according to a conventional example. FIG. 22 is a diagram showing an AD conversion sequence according to the conventional example. FIG. 23 is a block diagram showing a configuration example of a voltage detection circuit 10E according to Embodiment 5. FIGS. 24A to 24C are diagrams showing an example of an AD conversion sequence according to Embodiment 5-1. FIG. 24A is a diagram showing a case of Embodiment 5-1-1 where monitor voltage measurement is performed. FIG. 24B is a diagram showing a case of Embodiment 5-1-2 where monitor voltage measurement is performed. FIG. 24C is a diagram showing a case of Embodiment 5-1-3 where monitoring voltage measurement is performed.

As shown in FIG. 21, an AD converter 12 may measure a monitor voltage (thermistor voltage, regulator voltage, or the like) other than the cell voltages. FIG. 21 shows an example of monitoring the thermistor voltage.

As shown in FIG. 22, since the voltage detection circuit 10D of the conventional example AD-converts the monitor voltage with a fixed period, when disturbance noise at a frequency equal to or higher than one-half of a frequency corresponding to the fixed period is superimposed on a monitor input terminal, aliasing occurs to cause deterioration in voltage measurement accuracy. In the example of FIG. 21, the monitor voltage is AD-converted after AD conversion of the cell 5.

In Embodiment 5-1 of the present invention, as shown in FIGS. 24A to 24C, the measurement operation of each of Embodiments 1 to 4 described above is performed including the monitor voltage in the cyclic group for the cell voltage measurement, so that the time interval for the AD conversion is changed. That is, the slot for AD conversion of the monitor voltage is also changed in conjunction with the conversion start cell. In the examples of FIGS. 24A to 24C, the monitor voltage is AD-converted after AD conversion of the cell 5, and the conversion slot is also changed in the order of 8→5→3 in conjunction with the conversion start cell.

As described above, according to Embodiment 5-1, the aliasing of the monitor voltage can be reduced by changing the order of cell selection by the MUX 11, including the monitor voltage, to eliminate the periodicity of the AD conversion.

Embodiment 5-2

FIG. 25 is a diagram showing an example of an AD conversion sequence according to Embodiment 5-2.

For performing the precharge control, only the cell voltage-based MUX 11 shown in FIG. 23 may be operated. Therefore, by making the cell voltage-based switch independent of the monitor voltage-based switch, it is possible to AD-convert the monitor voltage during the precharge operation, as shown in FIG. 25.

As described above, according to Embodiment 5-2, by AD-converting the monitor voltages during the precharge operation, the number of conversion slots in the first cycle can be reduced, and the cyclic period can thus be shortened. As a result, the cell voltages can be measured more frequently, so that the states of the assembled battery system can be detected in detail.

Modified Embodiment 1

Figure 26:
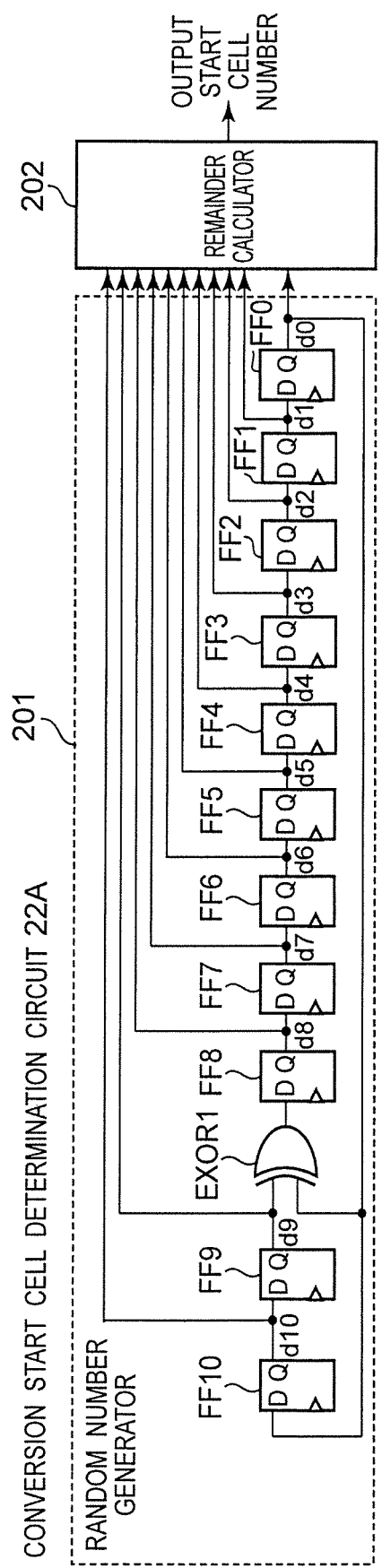
FIG. 26 is a block diagram showing a configuration example of a conversion start cell determination circuit 22A according to Modified Embodiment 1.

FIG. 26 is a block diagram showing a configuration example of a conversion start cell determination circuit 22A according to Modified Embodiment 1. FIG. 27 is a table showing the relationship between a remainder value of a remainder calculator 202 of FIG. 26 and a start cell number. Referring to FIG. 26, the conversion start cell determination circuit 22A includes a random number generator 201 and the remainder calculator 202. In this case, the random number generator 201 is configured to include a plurality of delayed flip-flops FF0 to FF10 and an exclusive OR gate EXOR1.

The conversion start cell determination circuit 22A outputs to the sequencer which cell (start cell number) the conversion is to be started within the group. In this case, the start cell number is generated using a natural random number, a pseudo random number, a cyclic sequence, or the like, and a different value is selected for each measurement period of the group.

FIG. 26 shows a configuration example of the conversion start cell determination circuit 22A using the random number generator 201. The random number generated by the random number generator 201 is processed using the remainder calculator 202 to select the start cell number.

The random number generator 201 generates an 11-bit pseudo-random number by, for example, a linear feedback shift register (LFSR). Then, the start cell number is determined based on the generated pseudo random number. Specifically, the values from 1 to 2047 are randomly outputted, circulated in 2047 times, and outputted again in the same order. A value of 1 to 2047 appears only once during this cycle.

Figure 2:
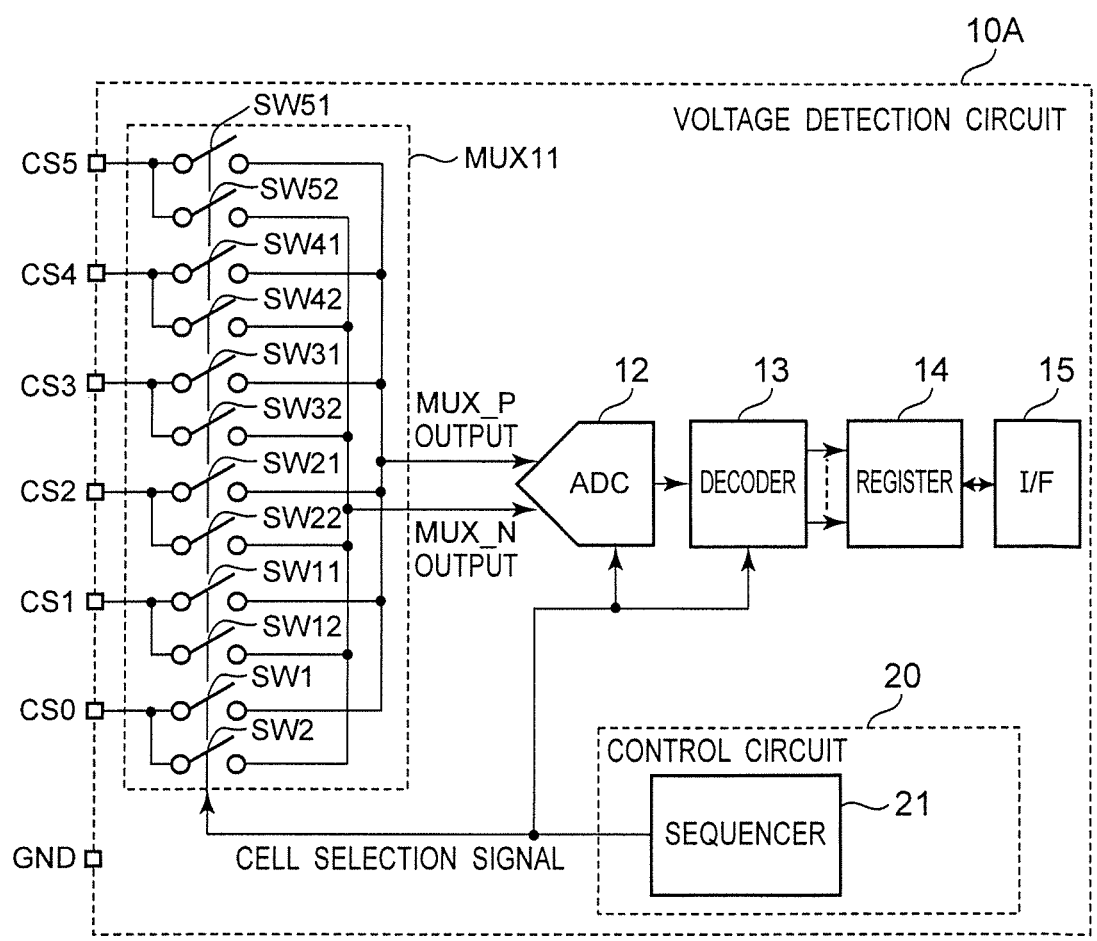
FIG. 2 is a block diagram showing a configuration of a voltage detection circuit 10A of FIG. 1.

The remainder calculator 202 performs remainder operation on the output value of the random number generator 201 to determine the start cell number, and outputs the determined number. For example, in the case of the 5-cell configuration as shown in FIG. 1, by dividing the output value (1 to 2047) of the random number generator 201 by 5, the remainder value of 0 to 4 is obtained, to determine the start cell number of 1 to 5 (See FIG. 27).

Modified Embodiment 2

Figure 28A:
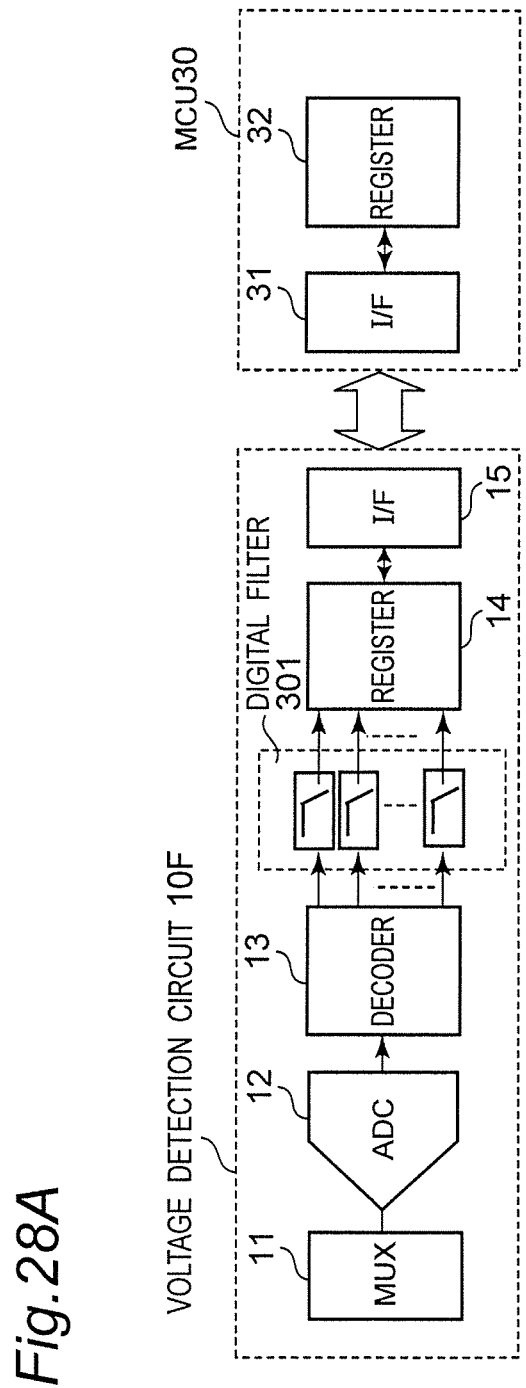
FIG. 28A is a block diagram showing a mounting example of a digital filter according to Modified Embodiment 2, upon mounting the digital filter in a voltage detection circuit.
Figure 28B:
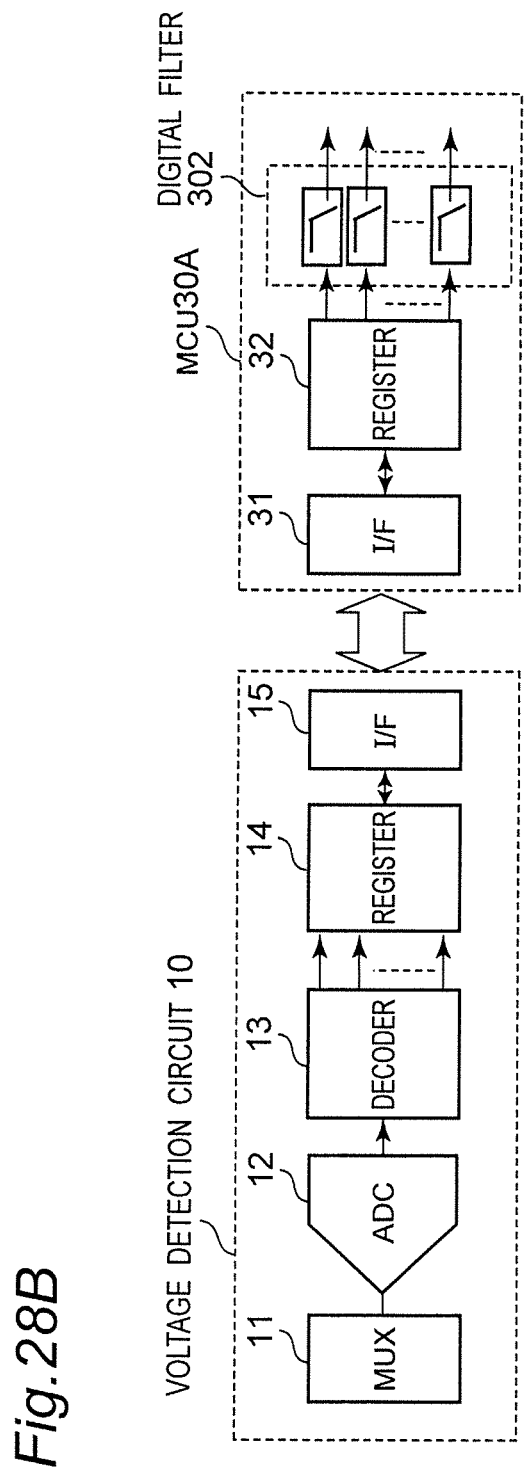
FIG. 28B is a block diagram showing a mounting example of a digital filter according to Modified Embodiment 2, upon mounting the digital filter in an MCU.

FIGS. 28A and 28B are block diagrams each showing a mounting example of a digital filter according to Modified Embodiment 2. FIG. 28A is a block diagram upon mounting a digital filter 301 in a voltage detection circuit 10F. FIG. 28B is a block diagram upon mounting a digital filter 302 in an MCU 30A. Referring to FIG. 28A, the MCU 30 is configured to include an interface (I/F) 31 and a register 32. The interface (I/F) 31 is connected to the interface (I/F) 15 of the voltage detection circuit 10F, receives data of the cell voltages from the interface (I/F) 15, performs predetermined signal conversion, and then stores the data after the signal conversion into the register 32.

As described above, by changing the AD conversion start cell, the frequency component of the disturbance noise is dispersed in a wide band, thus enabling reduction in the aliasing. Further, by processing the AD conversion data of each cell in each cyclic period by individual low-pass digital filters 301, 302 for each cell, a high-frequency component of disturbance noise can be removed, thus enabling more highly accurate voltage measurement.

As positions in which the digital filters 301, 302 are mounted, as shown in FIGS. 28A and 28B, the voltage detection circuit 10F and the MCU 30A can be considered. By mounting the digital filter into the voltage detection circuit, synchronization between the AD conversion and the digital filter can be ensured. There is thus an advantage of being able to prevent the aliasing upon capturing of data into the digital filter. When the digital filter 302 is mounted in the MCU 30A, the AD conversion data for each cell stored in the register 14 of the voltage detection circuit 10 is read by data communication in a serial peripheral interface (SPI) mode, and then, digital filter processing is performed.

As means for removing a high-frequency component, instead of using the digital filters 301, 302, AD conversion data of each cell in each cyclic period may be averaged.

Modified Embodiment 3

Figure 29:
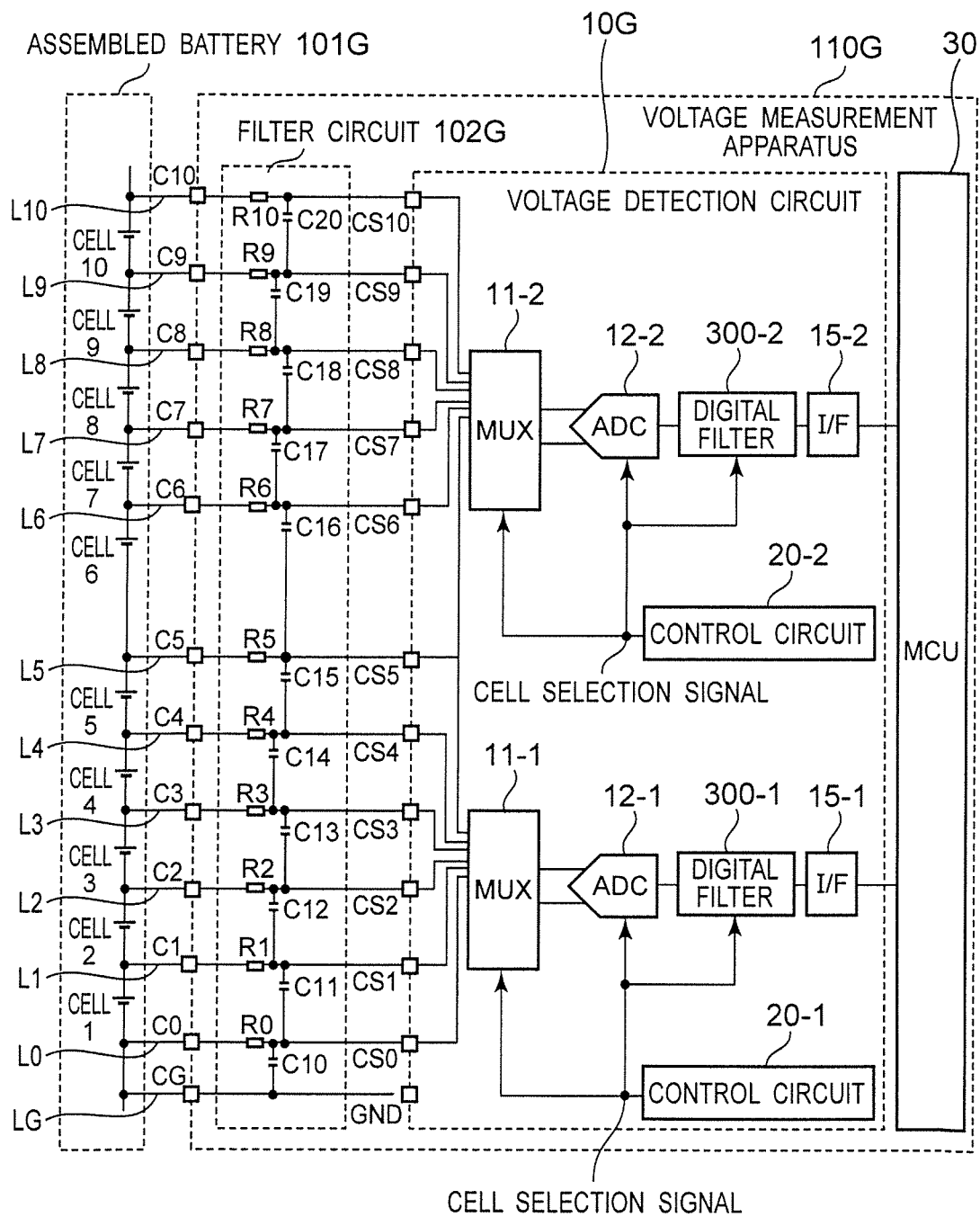
FIG. 29 is a block diagram showing a configuration example of an assembled battery system 100G according to Modified Embodiment 3.

FIG. 29 is a block diagram showing a configuration example of an assembled battery system 100G according to Modified Embodiment 3. FIG. 29 shows a voltage detection circuit 10G having another configuration example. The assembled battery system 100G is configured to include an assembled battery 101G and a voltage measurement apparatus 110G. In this case, the voltage measurement apparatus 110G is configured to include a filter circuit 102G, a voltage detection circuit 10G, and an MCU 30. It is noted that LG and L0 to L10 are voltage detection lines.

As shown in FIG. 29, the voltage detection circuit 10G may be mounted with a plurality of MUXs 11-1, 11-2, AD converters 12-1, 12-2, digital filters 300-1, 300-2, interfaces 15-1, 15-2, and control circuits 20-1, 20-2. In this case, the cyclic group is determined by units of the respective MUXs 11-1, 11-2. In the case of FIG. 29, the cyclic group is formed of two groups of cells 1 to 5 and cells 6 to 10, and the multiplexer performs cyclic operation in each of the groups.

Modified Embodiment 4

Figure 30:
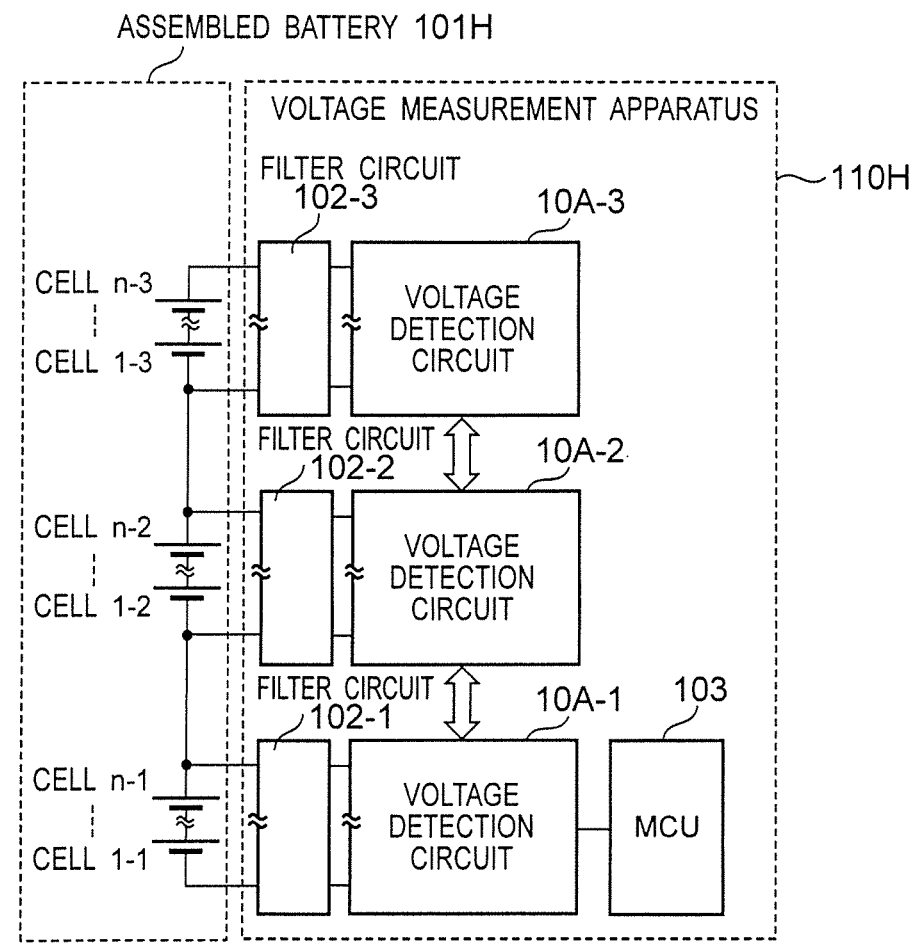
FIG. 30 is a block diagram showing a configuration example of an assembled battery system 100H according to Modified Embodiment 4.

FIG. 30 is a block diagram showing a configuration example of an assembled battery system 100H according to Modified Embodiment 4. FIG. 30 shows a voltage measurement apparatus 110H having another configuration example. The assembled battery system 100H is configured to include an assembled battery 101H and a voltage measurement apparatus 110H.

As shown in FIG. 30, the assembled battery system 100H may be achieved by being mounted with units (battery monitoring ICs, and the like) taking filter circuits 102-1, 102-2, 102-3 and voltage detection circuits 10A-1, 10A-2, 10A-3 as units for a plurality of battery cells (1-1 to n-1; 1-2 to n-2; 1-3 to n-3), respectively. Data of each unit is connected through a communication line, and is outputted to the MCU 103. In the example of FIG. 30, the cyclic group is formed of three groups of cells 1-1 to n-1, cells 1-2 to n-2, and cells 1-3 to n-3, and the multiplexer performs cyclic operation in each of the groups.

Modified Embodiment 5

Figure 31A:
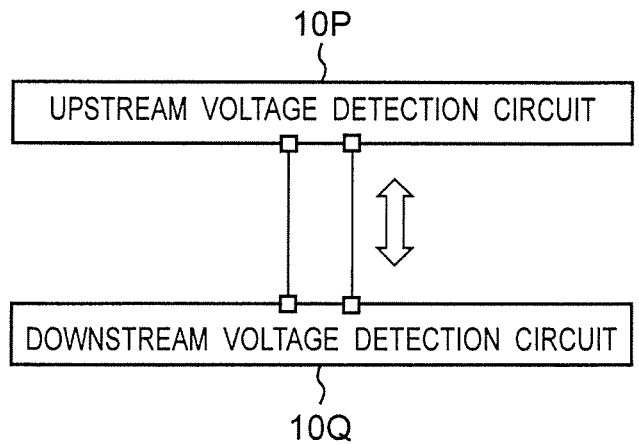
FIG. 31A is a block diagram showing a configuration example of a direct connection scheme which is a scheme example of a communication line between voltage detection circuits according to Modified Embodiment 5.
Figure 31B:
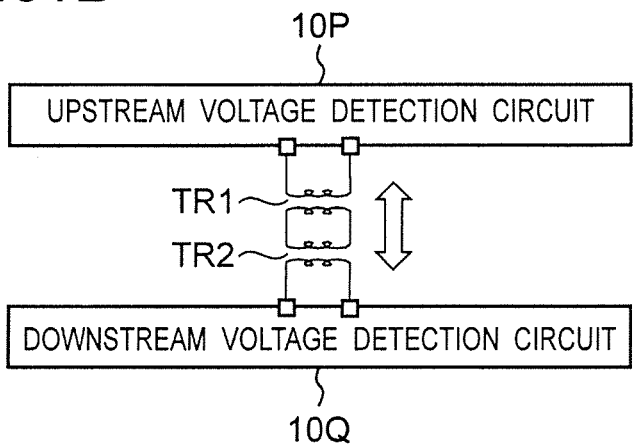
FIG. 31B is a block diagram showing a configuration example of a transformer scheme which is a scheme example of the communication line between the voltage detection circuits according to Modified Embodiment 5.
Figure 31C:
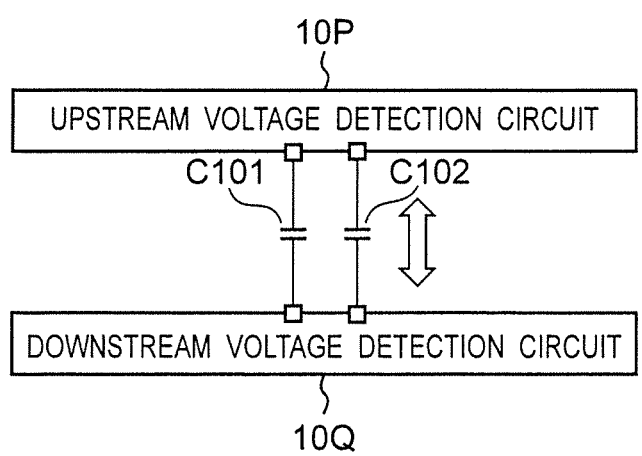
FIG. 31C is a block diagram showing a configuration example of a capacitive scheme which is a scheme example of the communication line between the voltage detection circuits according to Modified Embodiment 5.

FIGS. 31A to 31C are block diagrams each showing a scheme example of a communication line between voltage detection circuits according to Modified Embodiment 5. FIGS. 31A to 31C each show a configuration example of a communication scheme (daisy-chain connection) between the voltage detection circuits.

(1) FIG. 31A: in the direct connection scheme, signals are communicated by being directly connected through communication cables.

(2) FIG. 31B: in a transformer scheme, insulation communication is performed in which signals are transmitted using the transformers TR1, TR2.

(3) FIG. 31C: in a capacitive scheme, insulation communication is performed in which signals are transmitted using capacitors C101, C102 of capacitive elements.

Modified Embodiment 6

The voltage detection circuits and the voltage measurement apparatuses according to the above embodiments may be configured as voltage detection circuits and voltage measurement apparatuses using the following voltage measurement methods, respectively. Specific configurations are as follows:

A voltage measurement method according to the first aspect of Modified Embodiment 6 is a voltage measurement method of performing AD conversion after selecting voltages of a plurality of cells with a multiplexer, characterized in that a time interval for which the multiplexer selects each cell is switched over to change a period of the AD conversion.

A voltage measurement method according to the second aspect of Modified Embodiment 6 is characterized in that, in the voltage measurement method according to the first aspect of Modified Embodiment 6, the AD conversion of the cells is repeated in a predetermined order in the group and a conversion start cell in the group is switched over. This leads to changing of the selection time interval.

A voltage measurement method according to the third aspect of Modified Embodiment 6 is characterized in that, in the voltage measurement method according to the second aspect of Modified Embodiment 6, the conversion start cell is selected using a random number generator.

A voltage measurement method according to the fourth aspect of Modified Embodiment 6 is characterized in that, in the voltage measurement method according to the second or third aspect of Modified Embodiment 6, when the conversion start cell is not the lowest cell in the group of the multiplexer, the multiplexer first selects intermediate cell(s) so as to going through the intermediate cell(s) or selects the conversion start cell itself, and selects the conversion start cell after precharge operation.

A voltage measurement method according to the fifth aspect of Modified Embodiment 6 is characterized in that, in the voltage measurement method according to any one of the first to fourth aspects of Modified Embodiment 6, when a cell to be AD-converted is separated by two or more cells, a cell not being the next conversion target cell is selected to be gone through, or the next conversion target cell itself is selected, and the conversion target cell is selected after precharge operation.

A voltage measurement method according to the sixth aspect of Modified Embodiment 6 is characterized in that, in the voltage measurement method according to the fourth or fifth aspect of Modified Embodiment 6, in the precharge operation, an input terminal unused by the multiplexer is also a target for going through selection.

A voltage measurement method according to the seventh aspect of Modified Embodiment 6 is characterized in that, in the voltage measurement method according to any one of the first to sixth aspects of Modified Embodiment 6, a function of AD-converting a monitor voltage other than the cell voltages is provided, and the control circuit switches over a time interval for which the multiplexer selects the monitor voltage to change the period of the AD conversion.

A voltage measurement method according to the eighth aspect of Modified Embodiment 6 is characterized in that, in the voltage measurement method according to the seventh aspect of Modified Embodiment 6, the monitor voltage is AD-converted during the precharge operation.

The invention claimed is:

1. A voltage detection circuit for measuring a plurality of cell voltages of an assembled battery configured by connecting a plurality of cells in series, the voltage detection circuit comprising:

a plurality of input terminals connected to respective electrodes of the plurality of cells through a plurality of voltage detection lines;

a multiplexer that periodically selects and outputs voltages of a plurality of cells in a group, a plurality of series cells configured as the group;

an analog-to-digital (AD) converter that AD-converts an output voltage from the multiplexer and outputs digital data of the output voltage; and a control circuit that controls a timing for the selection by the multiplexer and a timing for the AD conversion, wherein the control circuit switches over a time interval for which the multiplexer selects each of the cells to change a period of the AD conversion, and wherein the control circuit repeats the AD conversion of the cells in a predetermined order in the group, and switches over a conversion start cell in the group to change the selection time interval.

2. The voltage detection circuit as claimed in claim 1, wherein the conversion start cell is selected based on a random number from a random number generator that generates a random number.

3. The voltage detection circuit as claimed in claim 2, further comprising a remainder calculator that performs remainder operation on a random number of an output value from the random number generator to determine and output a start cell number.

4. The voltage detection circuit as claimed in claim 1,
wherein, when the conversion start cell is not the lowest cell in the group of the multiplexer,
(A) the multiplexer first selects at least one intermediate cell so as to go through the intermediate cell, and then selects a conversion start cell; or
(B) the multiplexer selects the conversion start cell without any intermediate cell,
and the multiplexer performs a precharge operation, and then the conversion target cell.

5. The voltage detection circuit as claimed in claim 1,
wherein, when a cell to be AD-converted is separated by two or more cells,
(A) the multiplexer first selects at least one intermediate cell which is not any next conversion target cell so as to go through the intermediate cell, and then selects the next conversion cell; or
(B) the multiplexer selects the next conversion cell,
and the multiplexer performs a precharge operation, and then select the conversion target cell.

6. The voltage detection circuit as claimed in claim 4, wherein, in the precharge operation, an input terminal unused by the multiplexer is also a target for selecting the input terminal so as to go through the input terminal.

7. The voltage detection circuit as claimed in claim 1, comprising a function of AD-converting a monitor voltage other than the cell voltages,
wherein the control circuit switches over a time interval for which the multiplexer selects the monitor voltage to change the period of the AD conversion.

8. The voltage detection circuit as claimed in claim 7, wherein the monitor voltage is AD-converted during the precharge operation.

9. A voltage measurement apparatus for measure a plurality of cell voltages of an assembled battery configured by connecting a plurality of cells in series, the voltage measurement apparatus comprising:
a voltage detection circuit; and
an apparatus controller,
wherein the voltage detection circuit comprises:

a plurality of input terminals connected to respective electrodes of the plurality of cells through a plurality of voltage detection lines;

a multiplexer that periodically selects and outputs voltages of a plurality of cells in a group, a plurality of series cells connected to the multiplexer configured as the group;

an analog-to-digital (AD) converter that AD-converts an output voltage from the multiplexer and outputs digital data of the output voltage; and a control circuit that controls a timing for the selection by the multiplexer and a timing for the AD conversion, wherein the apparatus controller receives and stores the digital data of the output voltage, wherein the control circuit switches over a time interval for which the multiplexer selects each of the cells to change a period of the AD conversion, and wherein the control circuit repeats the AD conversion of the cells in a predetermined order in the group, and switches over a conversion start cell in the group to change the selection time interval.

10. An assembly battery system comprising:

a voltage detection circuit;

an apparatus controller; and an assembly battery configured by connecting a plurality of cells in series, wherein the assembly battery system is configured to measure a plurality of cell voltages of the assembled battery, wherein the voltage detection circuit comprises:

a plurality of input terminals connected to respective electrodes of the plurality of cells through a plurality of voltage detection lines;

a multiplexer that periodically selects and outputs voltages of a plurality of cells in a group, a plurality of series cells connected to the multiplexer configured as the group;

an analog-to-digital (AD) converter that AD-converts an output voltage from the multiplexer and outputs digital data of the output voltage; and a control circuit that controls a timing for the selection by the multiplexer and a timing for the AD conversion, wherein the apparatus controller receives and stores the digital data of the output voltage, wherein the control circuit switches over a time interval for which the multiplexer selects each of the cells to change a period of the AD conversion, and wherein the control circuit repeats the AD conversion of the cells in a predetermined order in the group, and switches over a conversion start cell in the group to change the selection time interval.

\* \* \* \* \*

UNITED STATES PATENT AND TRADEMARK OFFICE
CERTIFICATE OF CORRECTION

PATENT NO. : 11,313,886 B2
APPLICATION NO. : 16/642845
DATED : April 26, 2022
INVENTOR(S) : Naohisa Hatani et al.

Page 1 of 1

It is certified that error appears in the above-identified patent and that said Letters Patent is hereby corrected as shown below:

On the Title Page

At item (54) and in the Specification, Column 1, Lines 1-3, the title "VOLTAGE DETECTION CIRCUIT MEASUREMENT APPARATUS FOR USE IN ASSEMBLED BATTERY SYSTEM" should read -- VOLTAGE DETECTION CIRCUIT FOR VOLTAGE MEASUREMENT APPARATUS FOR USE IN ASSEMBLED BATTERY SYSTEM --.

Signed and Sealed this
Twenty-fourth Day of September, 2024

Katherine Kelly Vidal
*Director of the United States Patent and Trademark Office*